(12) United States Patent
Iyengar et al.

(10) Patent No.: US 10,130,013 B1
(45) Date of Patent: Nov. 13, 2018

(54) COOLING ELECTRONIC DEVICES IN A DATA CENTER

(71) Applicant: Google Inc., Mountain View, CA (US)

(72) Inventors: Madhu Krishnan Iyengar, Foster City, CA (US); Christopher G. Malone, Mountain View, CA (US); Gregory P. Imwalle, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/360,463

(22) Filed: Nov. 23, 2016

Related U.S. Application Data

(63) Continuation of application No. 14/534,566, filed on Nov. 6, 2014, now Pat. No. 9,596,787.

(51) Int. Cl.
*H05K 7/20* (2006.01)

(52) U.S. Cl.
CPC ......... *H05K 7/20809* (2013.01); *H05K 7/203* (2013.01); *H05K 7/20327* (2013.01)

(58) Field of Classification Search
CPC ............... H05K 7/203; H05K 7/20127; H05K 7/20318; H05K 7/20327; B29C 66/71; B29C 65/5057
USPC ........... 361/700, 679.26, 688, 699; 165/80.2, 165/185, 67; 439/271
See application file for complete search history.

(56) References Cited

U.S. PATENT DOCUMENTS

| | | | |
|---|---|---|---|
| 4,399,484 A | 8/1983 | Mayer | |
| 5,604,978 A * | 2/1997 | Sherif | H01L 23/3737 257/707 |
| 6,366,462 B1 * | 4/2002 | Chu | H01L 23/427 165/80.4 |
| 6,889,509 B1 | 5/2005 | Cader | |
| 8,619,425 B2 | 12/2013 | Campbell | |
| 2005/0082037 A1 | 4/2005 | Thayer et al. | |
| 2006/0059940 A1 | 3/2006 | Hess et al. | |
| 2008/0123297 A1 * | 5/2008 | Tilton | H05K 7/20345 361/700 |
| 2010/0073872 A1 * | 3/2010 | Pakravan | H05K 7/20572 361/695 |
| 2010/0101759 A1 | 4/2010 | Campbell et al. | |
| 2010/0263885 A1 | 10/2010 | Tuma | |
| 2014/0216686 A1 | 8/2014 | Shelnutt et al. | |
| 2014/0216688 A1 | 8/2014 | Shelnutt et al. | |
| 2014/0218858 A1 | 8/2014 | Shelnutt et al. | |

(Continued)

OTHER PUBLICATIONS https://www.3m.com/3M/en_US/company-us/all-3m-products/~/3M-Performance-Fluid-PF-5060?N=5002385+3294002097&rt=rud English translation provided.*

(Continued)

*Primary Examiner* — Mandeep S Buttar
(74) *Attorney, Agent, or Firm* — Fish & Richardson P.C.

(57) ABSTRACT

A data center cooling system includes an outer container that defines a first volume; an inner container that defines a second volume and is positioned within the first volume, the inner container including an air outlet that includes an airflow path between the first and second volumes; a liquid seal to fluidly isolate a liquid phase of a non-conductive coolant that fills at least a portion of the first and second volumes from an ambient environment; and a plurality of electronic heat-generating devices at least partially immersed in the liquid phase of the non-conductive coolant to transfer a heat load to the non-conductive coolant.

22 Claims, 13 Drawing Sheets

(56) References Cited

U.S. PATENT DOCUMENTS

| | | | |
|---|---|---|---|
| 2014/0218859 A1 | 8/2014 | Shelnutt et al. | |
| 2014/0218861 A1 | 8/2014 | Shelnutt et al. | |
| 2014/0355218 A1* | 12/2014 | Vinciarelli | H01R 43/205 361/728 |
| 2015/0359128 A1* | 12/2015 | Bailey | H05K 7/1487 361/679.46 |

OTHER PUBLICATIONS

Rich Miller, "Green Revolution's Immersion Cooling in Action," Data Center Knowledge, Apr. 12, 2011 retrieved from http://www.datacenterknowledge.com/archives/2011/04/12/green-revolutions-immersion-cooling-in-action/, 14 pages.

Rich Miller, "NSA Exploring Use of Mineral Oil to Cool its Servers," Data Center Knowledge, Sep. 4, 2014, retrieved from http://www.datacenterknowlege.com/archives/2014/09/04/nsa-exploring-use-mineral-oil-cool-servers/?utm_source=DailyNewsletter&utm_medium=email&utm_campaign=DailyNewsletterB&utm_content=09-05-2014, 8 pages.

Satish C. Mohapatra, "An Overview of Liquid Coolants for Electronics Cooling," Electronics Cooling, May 2006, retrieved from http://www.electronics-cooling.com/2006/05/an-overview-of-liquid-coolants-for-electronics-cooling/, 5 pages.

Rich Miller, "DataTank: Immersion Containers for Industrial Bitcoin Mining," Data Center Knowledge, Apr. 7, 2014, retrieved from http://www.datacenterknowledge.com/archives/2014/04/07/datatank-immersion-containers-industrial-bitcoin-mining/?utm_source=DailyNewsletter&utm_medium=email&utm_campaign=DailyNewsletterA&utm_content=Apr. 8, 2014, 7 pages.

Rich Miller, "New From 3M: Boiling Liquid to Cool Your Sewers," Data Center Knowledge, Apr. 9, 2014, retrieved from http://www.datacenterknowledge.com/archives/2014/04/09/new-3m-boiling-liquid-cool-servers/?utm_source=DailyNewsletter&utm_medium=email&utm_campaign=DailyNewsletterA&utm_content=Apr. 10, 2014, 7 pages.

Slashdot, "New Approach to Immersion Cooling Powers HPC in a High Rise," Nov. 14, 2013, retrieved from http://beta.slashdot.org/story/194329, 4 pages.

* cited by examiner

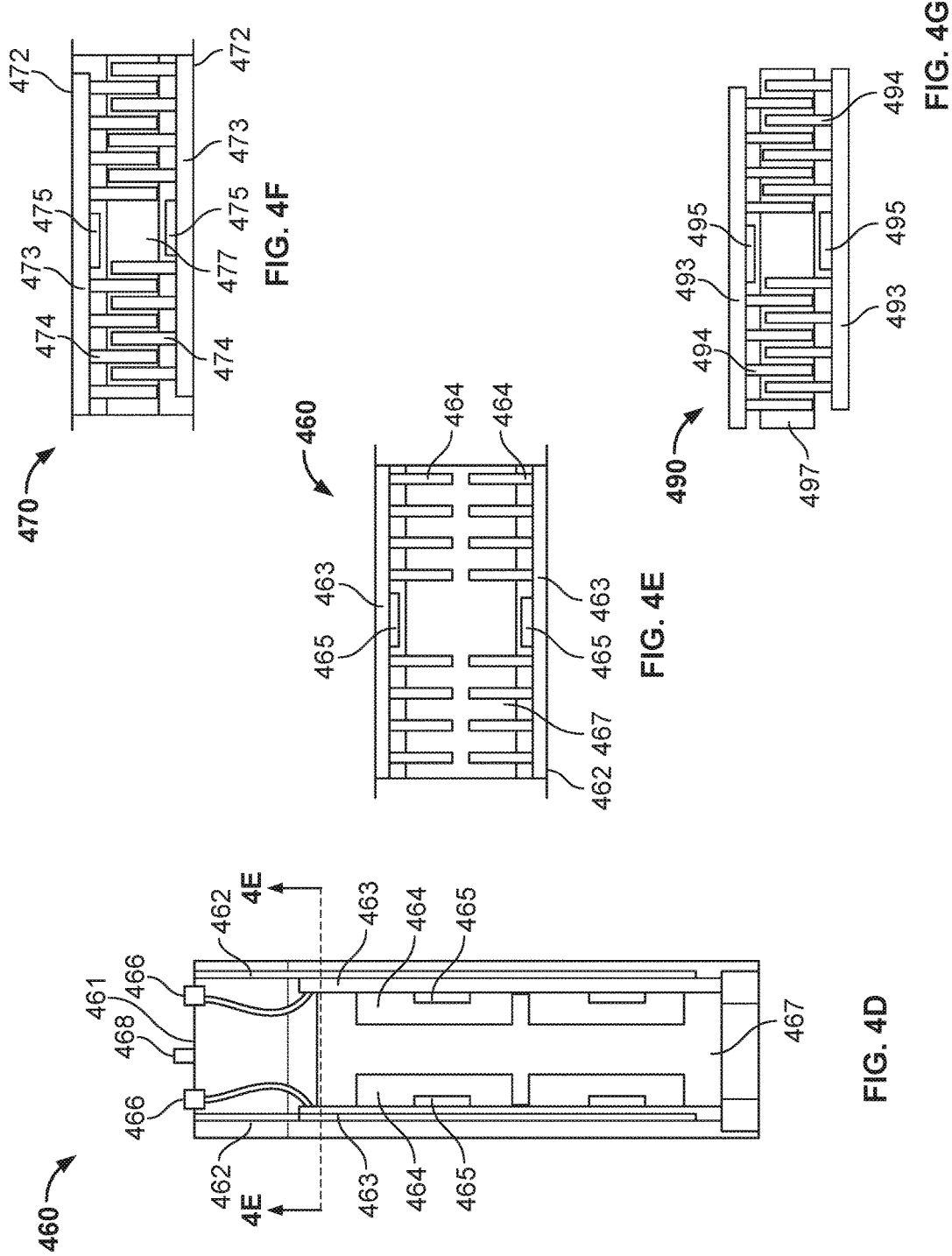

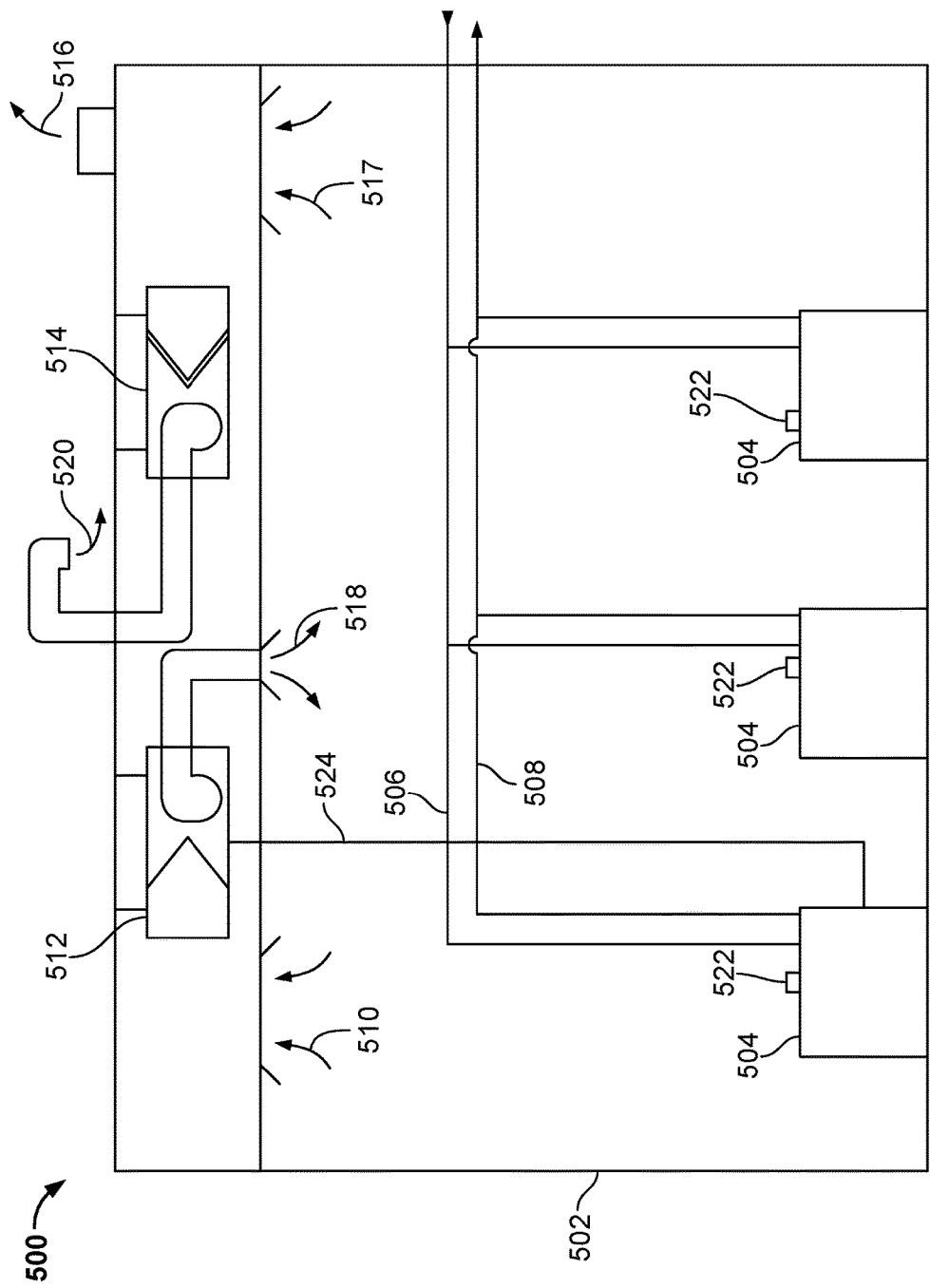

COOLING ELECTRONIC DEVICES IN A DATA CENTER

CROSS-REFERENCE TO RELATED APPLICATION

This application is a continuation of, and claims priority under 35 U.S.C. § 120 to, U.S. patent application Ser. No. 14/534,566, filed Nov. 6, 2014, and entitled "Cooling Electronic Devices in a Data Center," the entire contents of which are incorporated herein by reference.

TECHNICAL FIELD

This document relates to systems and methods for providing cooling to electronic equipment, such as computer server assemblies and related equipment in computer data centers, with a non-conductive coolant.

BACKGROUND

Computer users often focus on the speed of computer microprocessors (e.g., megahertz and gigahertz). Many forget that this speed often comes with a cost-higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, networking devices, and other heat-generating devices) that are located on a server or network rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

SUMMARY

This disclosure describes a data center cooling system that cools one or more electronic heat-generating devices with a non-conductive coolant. For example, the non-conductive coolant may be a dielectric coolant. In some aspects, a non-conductive coolant or dielectric coolant does not conduct an electric charge or conducts a small enough electric charge that operation of any electronic device immersed in such coolant is not affected. Examples of a non-conductive coolant or a dielectric coolant include, for instance, aromatics, silicate-ester, aliphatics, silicones, fluorocarbons, and oils such as mineral oil. In some aspects, the data center cooling system includes one or more inner containers that fluidly isolate the non-conductive coolant from an ambient environment along with an outer container that encloses the inner container. In some aspects, the data center cooling system includes a container for the electronic devices that includes a chimney or vertically extending housing that, for example, can at least partially enclose a cooling module to cool the non-conductive coolant. In some aspects, the electronic devices may be mounted with or to a server assembly that includes a filler to reduce a free (e.g., air filled) volume within one or more containers of the data center cooling system.

In an example implementation, a data center cooling system includes an outer container that defines a first volume; an inner container that defines a second volume and is positioned within the first volume, the inner container including an air outlet that includes an airflow path between the first and second volumes; a liquid seal to fluidly isolate a liquid phase of a non-conductive coolant that fills at least a portion of the first and second volumes from an ambient environment; and a plurality of electronic heat-generating devices at least partially immersed in the liquid phase of the non-conductive coolant to transfer a heat load to the non-conductive coolant.

In a first aspect combinable with the example implementation, the outer container includes a pressure relief valve configured to vent a portion of air, vented from the second volume through the air outlet and into the first volume, to the ambient environment.

In a second aspect combinable with any of the previous aspects, the outer container includes a base and a chimney that extends vertically from the base, the base including a first portion of the first volume and the chimney includes a second portion of the first volume that is in fluid communication with the first portion.

In a third aspect combinable with any of the previous aspects, the second portion defines a coolant recovery layer that includes a mixture of air and a vapor phase of the non-conductive coolant, a vapor condensing layer that includes substantially the vapor phase of the non-conductive coolant, and a liquid sub-cooling layer that includes substantially the liquid phase of the non-conductive coolant.

A fourth aspect combinable with any of the previous aspects further includes a cooling module mounted in the chimney and configured to cool the non-conductive coolant.

In a fifth aspect combinable with any of the previous aspects, the cooling module includes a cooling coil that includes a cooling fluid inlet and a cooling fluid outlet.

A sixth aspect combinable with any of the previous aspects further includes a pump positioned in the liquid sub-cooling layer of the second portion of the first volume.

A seventh aspect combinable with any of the previous aspects further includes one or more nozzles that are fluidly coupled to the pump and positioned in the vapor condensing layer of the second portion of the first volume.

In an eighth aspect combinable with any of the previous aspects, the one or more nozzles is fluidly coupled to the pump through one or more conduits that extend from the first volume into the second volume.

In a ninth aspect combinable with any of the previous aspects, the non-conductive coolant includes a single-phase non-conductive coolant.

A tenth aspect combinable with any of the previous aspects further includes a pump positioned in a liquid sub-cooling layer of the first volume.

An eleventh aspect combinable with any of the previous aspects further includes a cooling module positioned in the first volume that extends between the liquid sub-cooling level and a vapor condensing level of the first volume.

A twelfth aspect combinable with any of the previous aspects further includes one or more nozzles that are fluidly coupled to the pump and positioned in the vapor condensing layer of the first volume.

In a thirteenth aspect combinable with any of the previous aspects, the outer container includes a human-occupiable housing, and the first volume includes a human-occupiable workspace.

In a fourteenth aspect combinable with any of the previous aspects, the non-conductive coolant includes a dielectric coolant.

In another example implementation, a method for cooling electronic heat-generating devices in a data center includes enclosing a plurality of electronic heat-generating devices in a volume defined by a first container; immersing the plurality of electronic heat-generating devices in a liquid phase of a non-conductive coolant; enclosing the first container in a second volume of a second container, the non-conductive coolant filling at least a portion of the first and second volumes; sealing the liquid phase of the non-conductive coolant from an ambient environment; and transferring a heat load from the plurality of electronic heat-generating devices to the liquid phase of the non-conductive coolant.

A first aspect combinable with the example implementation further includes forming an airflow path between the first and second volumes.

A second aspect combinable with any of the previous aspects further includes venting a portion of air from the first volume, through the airflow path, through the second volume and to the ambient environment.

In a third aspect combinable with any of the previous aspects, the second container includes a base and a chimney that extends vertically from the base, the base including a first portion of the second volume and the chimney includes a second portion of the second volume that is in fluid communication with the first portion.

A fourth aspect combinable with any of the previous aspects further includes cooling a mix of air and a first portion of a vapor phase of the non-conductive coolant in a top portion of the chimney to condense the first portion of the vapor phase to the liquid phase of the non-conductive coolant.

A fifth aspect combinable with any of the previous aspects further includes cooling a second portion of the vapor phase of the non-conductive coolant in a middle portion of the chimney to condense the second portion of the vapor phase to the liquid phase of the non-conductive coolant.

A sixth aspect combinable with any of the previous aspects further includes sub-cooling the liquid phase of the non-conductive coolant in a bottom portion of the chimney.

A seventh aspect combinable with any of the previous aspects further includes circulating a portion of the sub-cooled liquid phase of the non-conductive coolant from the bottom portion of the chimney to the first volume to contact the plurality of electronic heat-generating devices.

An eighth aspect combinable with any of the previous aspects further includes supplying a cooling fluid to a cooling module positioned in the chimney.

In a ninth aspect combinable with any of the previous aspects, the non-conductive coolant includes a single-phase non-conductive coolant.

A tenth aspect combinable with any of the previous aspects further includes circulating a sub-cooled liquid phase of the non-conductive liquid coolant from a bottom portion of the second volume to a top portion of the second volume.

An eleventh aspect combinable with any of the previous aspects further includes circulating the sub-cooled liquid in the top portion over a cooling module positioned in the second volume.

In a twelfth aspect combinable with any of the previous aspects, the second container includes a human-occupiable housing, and the second volume includes a human-occupiable workspace.

In a thirteenth aspect combinable with any of the previous aspects, the non-conductive coolant includes a dielectric coolant.

In another example implementation, a system includes a first housing adapted to enclose a plurality of server assemblies, at least one of the server sub-assemblies including a top that sealingly engages the first housing and a server board coupled to the top; a second housing that encloses the first housing; and a dielectric coolant enclosed within the first and second housings to cool the server board.

In a first aspect combinable with the example implementation, the dielectric coolant includes a liquid phase substantially contained within the second housing and a vapor phase substantially contained within the first housing.

A second aspect combinable with any of the previous aspects further includes a cooling coil mounted in the second volume to cool the liquid phase of the dielectric coolant, and condense the vapor phase of the dielectric coolant to the liquid phase of the dielectric coolant.

In a third aspect combinable with any of the previous aspects, the second housing includes a base housing and an extension housing that is coupled to the base housing and extends vertically from the base housing.

In a fourth aspect combinable with any of the previous aspects, the cooling coil is positioned in the extension housing.

A fifth aspect combinable with any of the previous aspects further includes a plurality of computing devices mounted on the server board.

A sixth aspect combinable with any of the previous aspects further includes an I/O patch panel mounted on the top and communicably coupled to the plurality of computing devices mounted on the server board.

A seventh aspect combinable with any of the previous aspects further includes a pump positioned in the liquid phase of the dielectric coolant to circulate the liquid phase of the dielectric coolant to a vapor phase layer of the first housing.

In another example implementation, a data center cooling system includes a container that defines a volume, the container including a base and a chimney that extends vertically from the base, the base including a first portion of the volume and the chimney includes a second portion of the volume that is in fluid communication with the first portion; a liquid seal to fluidly isolate a liquid phase of a non-conductive coolant that fills at least a portion of the volume from an ambient environment; and a plurality of electronic heat-generating devices at least partially immersed in the liquid phase of the non-conductive coolant to transfer a heat load to the non-conductive coolant.

In a first aspect combinable with the example implementation, the container includes a pressure relief valve configured to vent a portion of air, vented from the second volume through the air outlet and into the first volume, to the ambient environment.

In a second aspect combinable with any of the previous aspects, the second portion defines a coolant recovery layer that includes a mixture of air and a vapor phase of the non-conductive coolant, a vapor condensing layer that includes substantially the vapor phase of the non-conductive coolant, and a liquid sub-cooling layer that includes substantially the liquid phase of the non-conductive coolant.

A third aspect combinable with any of the previous aspects further includes a cooling module mounted in the chimney and configured to cool the non-conductive coolant.

In a fourth aspect combinable with any of the previous aspects, the non-conductive coolant includes a single-phase non-conductive coolant.

A fifth aspect combinable with any of the previous aspects further includes a pump positioned in a liquid sub-cooling layer of the volume.

A sixth aspect combinable with any of the previous aspects further includes a cooling module positioned in the volume that extends between the liquid sub-cooling level and a vapor condensing level of the volume.

A seventh aspect combinable with any of the previous aspects further includes one or more nozzles that are fluidly coupled to the pump and positioned in the vapor condensing layer of the volume.

In another example implementation, a data center cooling system includes a container that defines a volume; a liquid seal to fluidly isolate a liquid phase of a non-conductive coolant that fills at least a portion of the volume from an ambient environment; a plurality of electronic heat-generating devices at least partially immersed in the liquid phase of the non-conductive coolant to transfer a heat load to the non-conductive coolant; and a cooling module positioned in the volume to cool the non-conductive coolant.

In a first aspect combinable with the example implementation, the container includes a base and a chimney that extends vertically from the base, the base including a first portion of the volume and the chimney includes a second portion of the volume that is in fluid communication with the first portion.

In a second aspect combinable with any of the previous aspects, the second portion defines a coolant recovery layer that includes a mixture of air and a vapor phase of the non-conductive coolant, a vapor condensing layer that includes substantially the vapor phase of the non-conductive coolant, and a liquid sub-cooling layer that includes substantially the liquid phase of the non-conductive coolant.

In a third aspect combinable with any of the previous aspects, the cooling module is positioned in the volume to sub-cool the liquid phase of the non-conductive coolant in the liquid sub-cooling layer, and condense the vapor phase of the non-conductive coolant in the vapor condensing layer.

In a fourth aspect combinable with any of the previous aspects, the cooling module includes a cooling coil that includes a cooling liquid inlet and a cooling liquid outlet, the inlet and the outlet sealingly extending through the container.

In another example implementation, a server assembly includes a server board including a plurality of connector slots coupled to a front surface of the server board; a plurality of computing devices installed in at least a portion of the plurality of connector slots to define a server board topography; and a filler member coupled to the server board.

In a first aspect combinable with the example implementation, the filler member includes a filler surface that faces the front surface of the server board.

In a second aspect combinable with any of the previous aspects, the filler member substantially mirrors the server board topography to define a gap between the server board with the plurality of computing devices and the filler member.

A third aspect combinable with any of the previous aspects further includes a backing plate mounted to a back surface of the server board opposite the front surface.

A fourth aspect combinable with any of the previous aspects further includes a filler sub-member installed in a particular one of the plurality of connector slots such that the server board topography is defined, at least in part, by the installed filler sub-member.

In a fifth aspect combinable with any of the previous aspects, the gap is about 1-2 mm.

In a sixth aspect combinable with any of the previous aspects, the gap is based, at least in part, on a rate of heat transfer from the plurality of computing devices to a cooling fluid enclosed in the gap and in thermal conductive and/or convective contact with the plurality of computing devices.

In a seventh aspect combinable with any of the previous aspects, the cooling fluid includes a non-conductive liquid.

In an eighth aspect combinable with any of the previous aspects, the gap includes a boiling zone for the non-conductive liquid.

In a ninth aspect combinable with any of the previous aspects, the filler member includes a molded member made of a non-porous material.

Various implementations of a data center cooling system according to the present disclosure may include one, some, or all of the following features. For example, the data center cooling system may utilize a dielectric, or non-conductive, liquid coolant to cool one or more electronic heat-generating devices, such as processors, memory modules (e.g., DIMMs or other memory), networking devices, or otherwise. The dielectric, or non-conductive, liquid coolant is a liquid coolant that, in some aspects, retards or prevents electric charges from flowing therethrough, thereby allowing normal operation of the electronic heat-generating devices while immersed in the liquid coolant. As a further example, the data center cooling system may cool more densely packed or positioned electronic heat-generating devices as compared to conventional cooling systems. As another example, the data center cooling system may cool higher power electronic heat-generating devices within a similar space as compared to conventional cooling systems. Further, the data center cooling system may, as compared to conventional dielectric liquid cooling systems, use less dielectric liquid, with a lower cost, to cool the electronic devices. The data center cooling system may also prevent or substantially prevent the escape of liquid or vapor dielectric coolant. As a further example, the data center cooling system may utilize a single phase dielectric, or non-conductive, coolant liquid, thereby substantially preventing vapor bleed-off from the liquid. As yet another example, the data center cooling system may reduce a volume of space between and among the heat-generating devices through a filler, such as a molded filler. In another example, the data center cooling system may provide an extended volume to trap a vapor phase of the dielectric liquid coolant and return the vapor phase to a liquid phase. Thus, as compared to conventional liquid coolant systems, implementations described in the present disclosure may use or require substantially less dielectric liquid coolant.

The details of one or more embodiments are set forth in the accompanying drawings and the description below. Other features, objects, and advantages will be apparent from the description and drawings, and from the claims.

DESCRIPTION OF DRAWINGS

FIG. 4B-4G illustrate example implementations of a server assembly that includes a filler member for use in a data center cooling system that uses a non-conductive liquid coolant to cool one or more electronic heat-generating devices;

FIG. 5 is a schematic side view of another example implementation of a data center cooling system that uses a non-conductive liquid coolant to cool one or more electronic heat-generating devices.

DETAILED DESCRIPTION

This document discusses implementations of a data center cooling system that uses a non-conductive, or dielectric, coolant to remove heat generated by one or more heat-generating computing devices. The example data center cooling systems may fluidly isolate the non-conductive coolant from an ambient environment in one or multiple containers. The example data center cooling systems may cool the non-conductive coolant with one or more cooling modules contained in the one or multiple containers. In some aspects, the computing devices may be mounted or connected to a structure (e.g., server tray, server board, motherboard, or otherwise) to which a molded filler is coupled or inserted. A side of the molded filler may substantially mirror a topography of the structure that includes the computing devices.

Figure 1A:
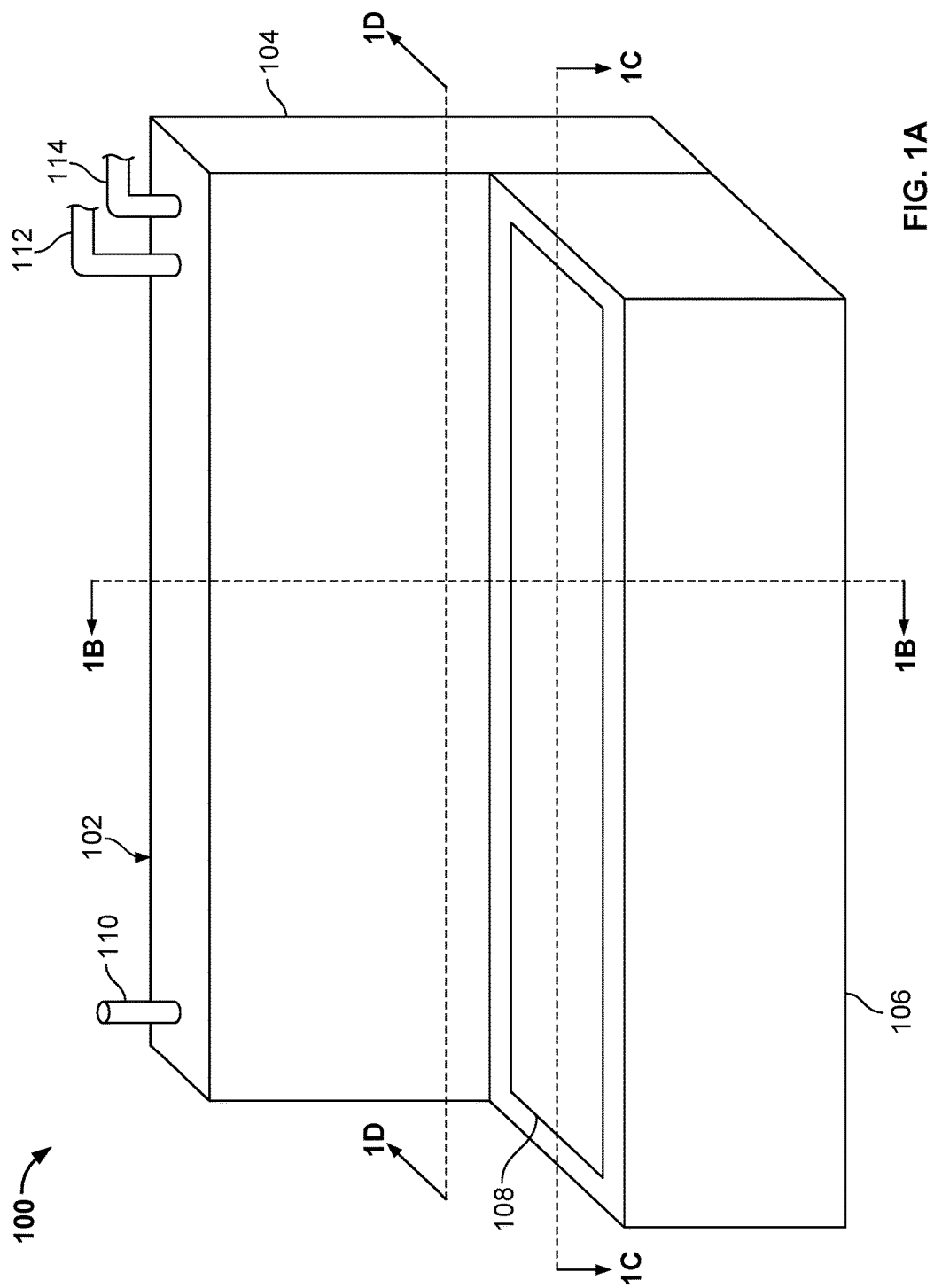
FIGS. 1A-1D illustrate various schematic views of an example implementation of a data center cooling system that uses a non-conductive liquid coolant to cool one or more electronic heat-generating devices.
Figure 1B:
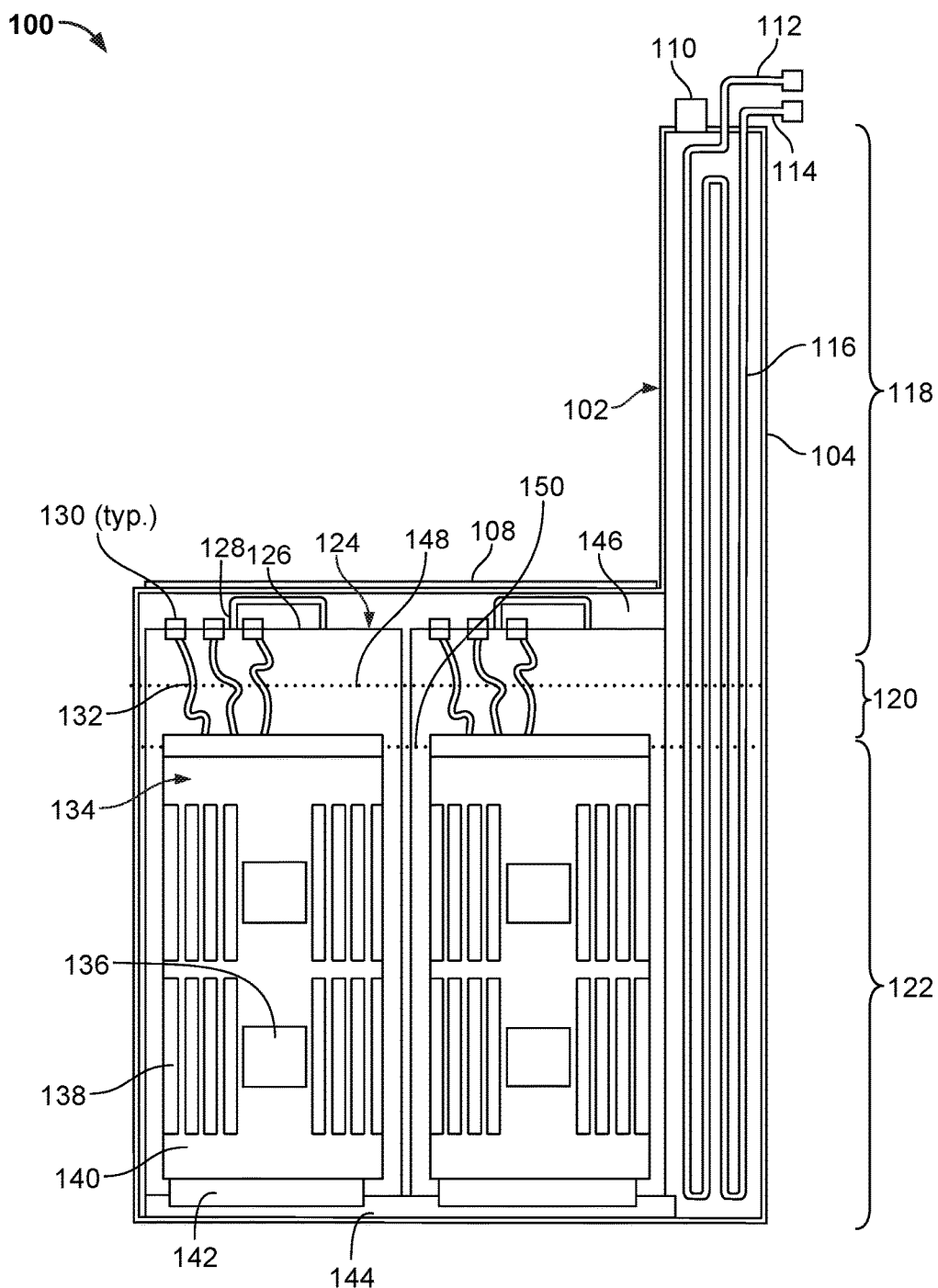
Figure 1C:
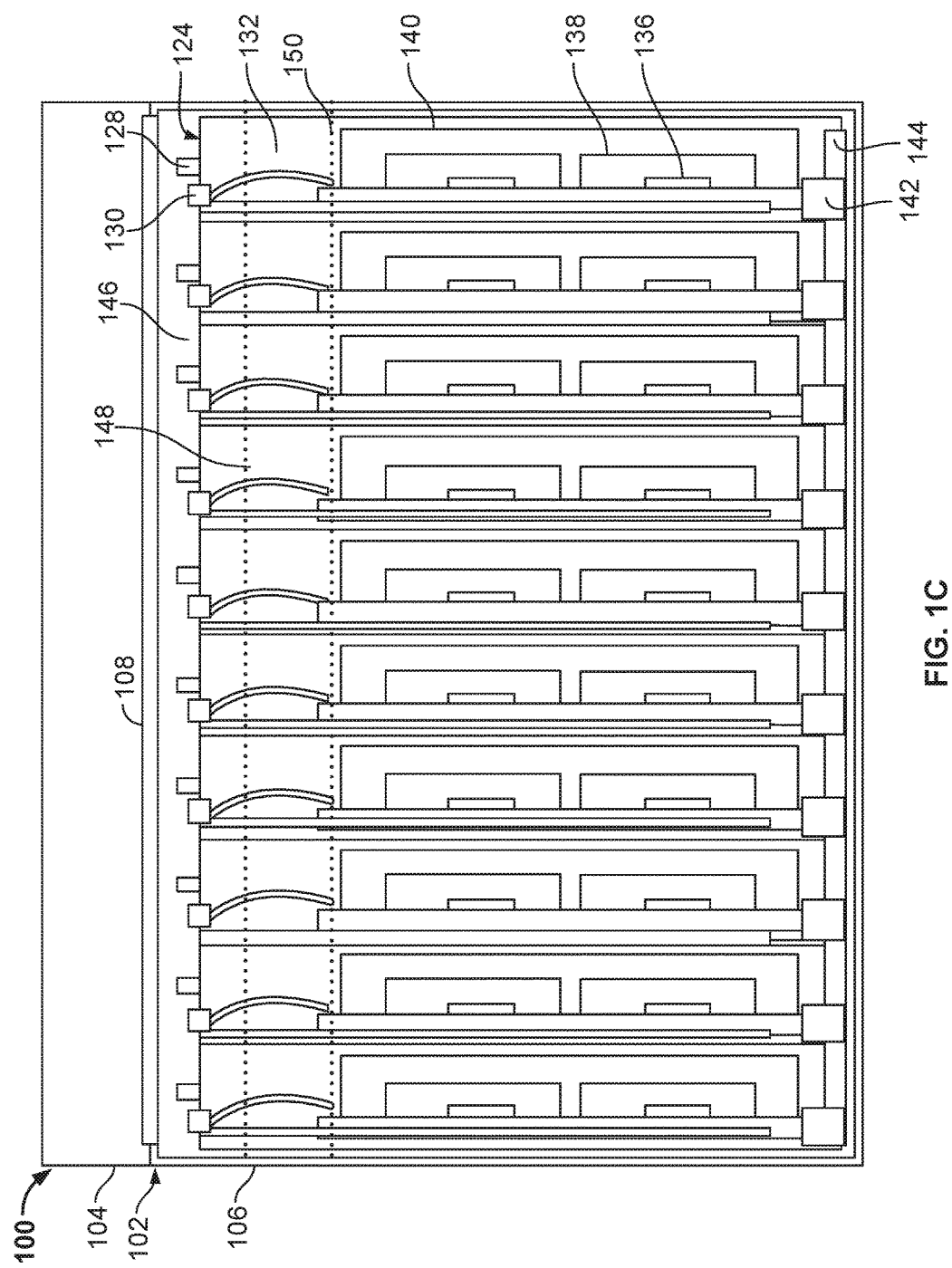
Figure 1D:
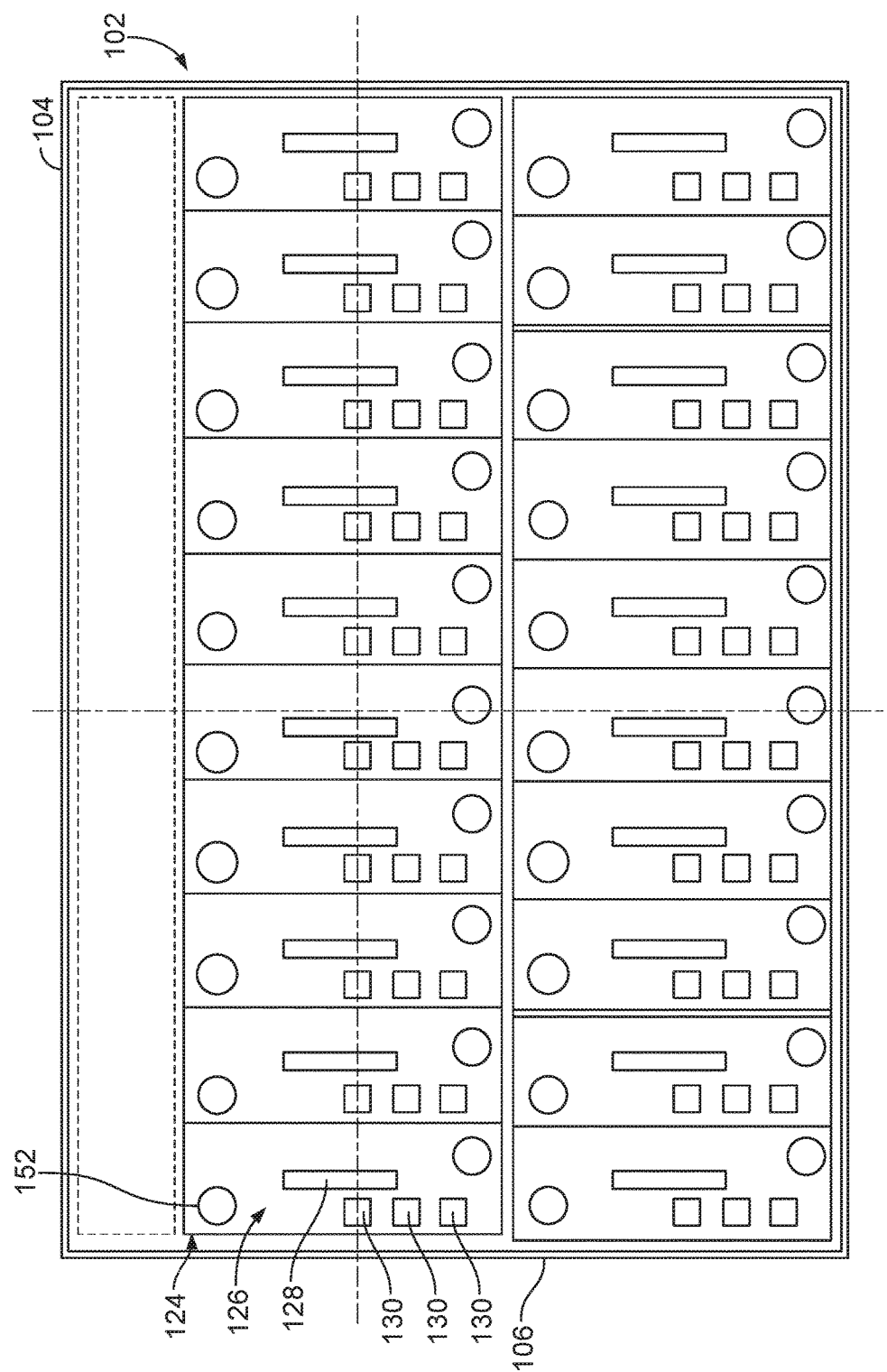

FIGS. 1A-1D illustrate various schematic views of an example implementation of a data center cooling system 100 that uses a non-conductive liquid coolant to cool one or more electronic heat-generating devices. FIG. 1B illustrates a sectional side view of the data center cooling system 100. FIG. 1C illustrates a sectional front view of the data center cooling system 100. FIG. 1D illustrates a sectional top view of the data center cooling system 100. Generally, the system 100 includes an outer container 102 that seals the non-conductive coolant (e.g., liquid and vapor) within the outer container 102. In the illustrated implementation, the outer container 102 comprises a base housing 106 and a chimney housing (or chimney) 104 that extends vertically from the base housing 106. In some implementations, the cooling system 100 can be approximately 50 inches wide (e.g., across the front of the base housing 106), 30 inches deep, and 72 inches tall (e.g., 36 inch height of base housing 106 plus 36 inch extended height of chimney 104 above the base housing 106).

In the illustrated implementation, access to a volume of the outer container 102 is facilitated by a removable cover 108 that includes or create a fluid seal between the volume and an ambient environment external to the outer container 102. The cover 108 may provide access to one or more server assemblies 134 (described below) as well as a liquid phase 150 of a non-conductive coolant, as well as other components of the system 100. The cover 108 may, in some implementations, substantially prevent any or all liquid or vapor non-conductive coolant from exiting the outer container through the base housing 106.

As shown, a relief device 110 may be positioned on the outer container 102, such as at a high point of the container 102 on top of the chimney 104. The relief device 110 may be a vent, orifice, pressure relief valve, or otherwise that allows a flow of air from the volume of the outer container 102 to the ambient environment external to the container 102. For example, as a pressure relief valve, the device may be preset to open at a particular pressure (e.g., internal to the container 102) to vent a build-up of air in the container 102. The air may be vented, for example, so that thermodynamic properties or processes within the container (e.g., cooling, condensing, or otherwise) are not substantially altered from a desired design. In some aspects, as described below, only air or substantially air, rather than a mix of air and a vapor phase 148 of the non-conductive coolant, may be vented to the ambient environment.

As illustrated, a cooling liquid supply 112 and a cooling liquid return 114 may be fluidly coupled to the system 100, e.g., through the outer container 102 and to a cooling module 112 mounted within the volume of the container 102. The cooling liquid supply 112 may be, for example, a chilled water supply, chilled glycol/refrigerant supply, an evaporatively-cooled liquid, or otherwise (e.g., a liquid coolant that is cooled through mechanical refrigeration, evaporation, or otherwise).

With references to FIGS. 1B-1D, one or more inner containers 124 are mounted within the volume of the outer container 102. Each of the illustrated inner containers 124 seal the liquid phase 150 and the vapor phase 148 of the non-conductive coolant within a volume of the inner container 124 that is in fluid communication, as shown, with the chimney 104. A top portion of the inner container 124 may be formed by a cover 126 that includes, in this implementation, a handle 126. As discussed later with reference to FIG. 4A, the cover 126 may form part of the sever assembly 134. In alternative embodiments, the cover 126 may be separated from the server assembly 134. In any event, the outer container 102 and inner container 124 (or containers 124) may form a container-in-container system that substantially seals the liquid phase 150 and the vapor phase 148 of the non-conductive coolant within the inner container 124 and chimney 104.

The illustrated server assembly 134, as shown, may be vertically positioned within the inner container 124 and, in this implementation, immersed within the liquid phase 150 of the non-conductive coolant in a sub-cooled liquid layer 122. The server assembly 134, in this example, includes one or more memory modules 138 (e.g., DIMMs or other memory modules), one or more processors 136 (e.g., CPUs or otherwise), and a power interconnect 142. In this example, these components may be mounted on a server board which is mounted to a backing plate 144.

The server assembly also includes one or more I/O patch panels 130 that are mounted above or to the cover 126 and connected to the memory modules 138 and/or processors 136 through connectors 132. As shown, the I/O patch panels 130 are positioned above the vapor phase 148 of the non-conductive coolant within a vapor condensing layer 120 and in an air/vapor mixture 146. The air/vapor mixture 146 may include a mix of air and the vapor phase 146 of the non-conductive coolant. In some embodiments, the mixture 146 may be substantially or mostly (or all) air.

Further, in this example, and as discussed in more detail below, the illustrated server assembly 134 includes a filler 140 that is mounted to or with the server assembly 134. The filler 140, generally, may eliminate or reduce an empty volume of the server assembly 134 (e.g., a space within the volumetric boundaries of the server assembly 134 that is not taken up by the components of the assembly 134). In some aspects, by reducing the amount of empty volume within the inner container 124, the amount of liquid phase 150 of the non-conductive coolant needed to cool the components of the server assembly 134 (e.g., the memory modules 138, processors 136, or otherwise) may also be reduced to save costs.

As illustrated in this implementation, a cooling module 116 is mounted within the chimney 104. Although the cooling module 116 shown here is a cooling coil (e.g., fin-and-tube heat exchanger), other forms of cooling modules, such as thermoelectric coolers, Peltier coolers, or otherwise, also are within the scope of the present disclosure. In this example, the cooling module 116 extends through all or most of the height of the chimney 104 (and can also extend a width of the chimney 104 as well). As illustrated, the cooling module 116 extends through several thermodynamic layers within the chimney 104 and the volume of the outer container 102 generally. At the bottom of the chimney 104, the cooling module 116 is positioned in the sub-cooled liquid layer 122, which contains all or mostly the liquid phase 150 of the non-conductive coolant. Here, the cooling module 116 can sub-cool the liquid phase 150, in which the server assemblies 134 are immersed to cool the components of the assemblies 134. Towards the middle of the chimney 104, the cooling module 116 extends through the vapor condensing layer 120, which contains all or mostly the vapor phase 148 of the non-conductive coolant. Here, the cooling module 116 cools, and thereby condenses, the vapor phase 146 to the liquid phase 150. Towards the top of the chimney 104, the cooling module 116 extends through a coolant recovery layer 118, which contains mostly or all air, but could also contain some of the vapor phase 148 of the non-conductive coolant. Here, the cooling module 116 cools the air to condense all or most of any remaining vapor phase 148 of the non-conductive coolant. Thus, at or near the pressure relief device 110, all or mostly air (and not costly non-conductive coolant) is vented to the ambient environment.

With reference to FIG. 1D specifically, each cover 126 includes one or more vent holes 152 that fluidly couple the volume of the inner containers 124 with the volume of the outer container 102 in the base housing 106. For example, the vent holes 152 allow for gaseous communication from the air/vapor mixture 146 in the coolant recovery layer 118 to exit the volume of the inner containers 124 to the volume of the outer container 104, including the coolant recovery layer 118 in the chimney 104.

Figure 2:
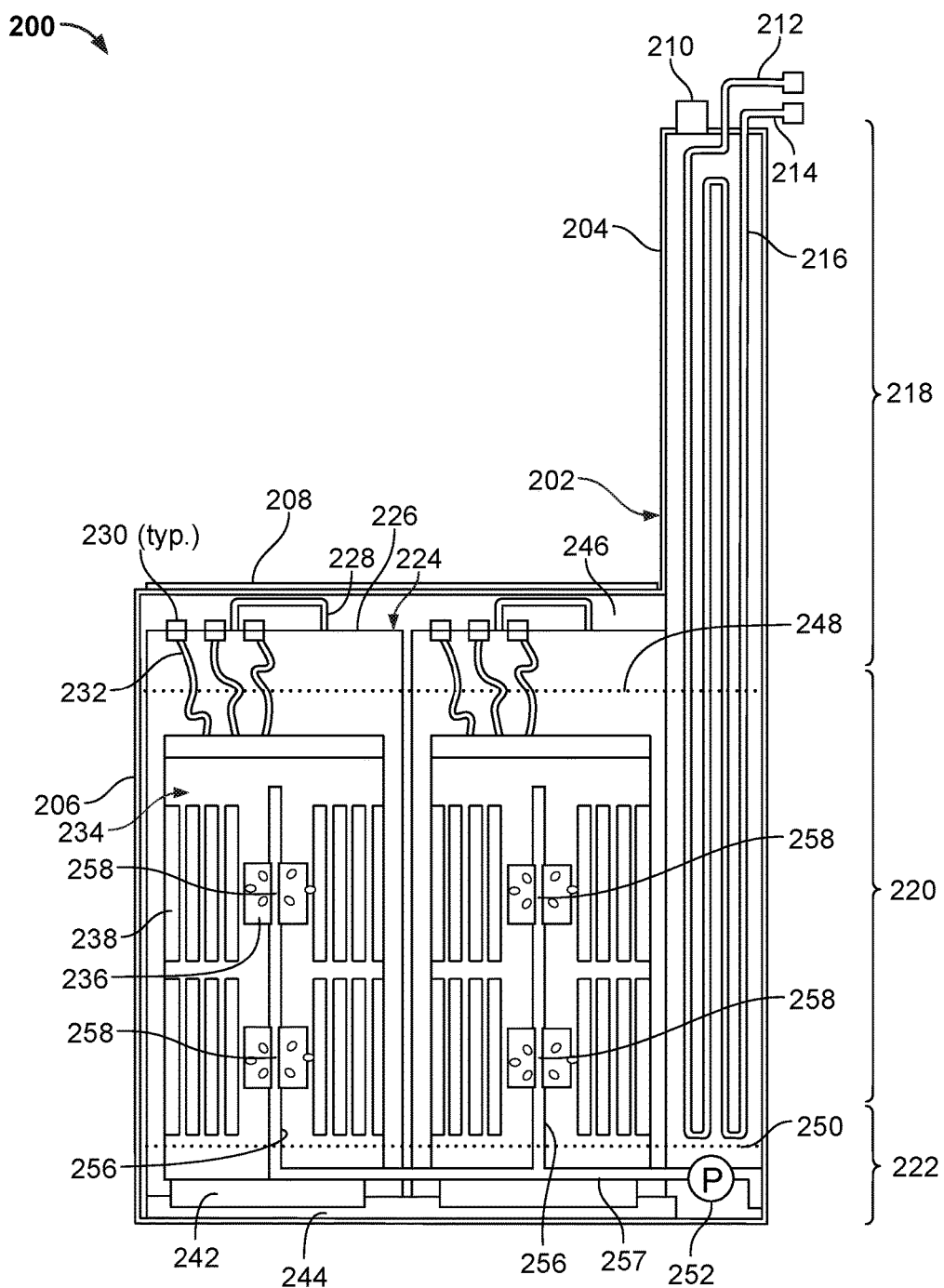
FIG. 2 illustrates a schematic side view of another example implementation of a data center cooling system that uses a non-conductive liquid coolant to cool one or more electronic heat-generating devices.

FIG. 2 illustrates a schematic side view of another example implementation of a data center cooling system 200 that uses a non-conductive liquid coolant. Generally, in this implementation, the data cooling system 200 includes a pump 252 that can circulate a liquid phase 250 of the non-conductive coolant upward from a bottom portion of an outer container 202 towards an upper portion of a base housing 206 of the outer container 202 to cool one or more heat-generating devices mounted on one or more server assemblies 234. In this implementation, a sub-cooled liquid layer 222 may be substantially thinner as compared to the implementation of the data center cooling system 100, thereby saving costly non-conductive coolant.

As illustrated in this side view, the system 200 includes an outer container 202 that seals the non-conductive coolant (e.g., liquid and vapor) within the outer container 202. In the illustrated implementation, the outer container 202 comprises a base housing 206 and a chimney housing (or chimney) 204 that extends vertically from the base housing 206. In some implementations, the cooling system 200 can be approximately 50 inches wide (e.g., across the front of the base housing 206), 30 inches deep, and 72 inches tall (e.g., 36 inch height of base housing 206 plus 36 inch extended height of chimney 204 above the base housing 206).

In the illustrated implementation, access to a volume of the outer container 202 is facilitated by a removable cover 208 that includes or create a fluid seal between the volume and an ambient environment external to the outer container 202. The cover 208 may provide access to one or more server assemblies 234 (described below) as well as a liquid phase 250 of a non-conductive coolant, as well as other components of the system 200. The cover 208 may, in some implementations, substantially prevent any or all liquid or vapor non-conductive coolant from exiting the outer container through the base housing 206.

As shown, a relief device 210 may be positioned on the outer container 202, such as at a high point of the container 202 on top of the chimney 204. The relief device 210 may be a vent, orifice, pressure relief valve, or otherwise that allows a flow of air from the volume of the outer container 202 to the ambient environment external to the container 202. For example, as a pressure relief valve, the device may be preset to open at a particular pressure (e.g., internal to the container 202) to vent a build-up of air in the container 202. The air may be vented, for example, so that thermodynamic properties or processes within the container (e.g., cooling, condensing, or otherwise) are not substantially altered from a desired design. In some aspects, as described below, only air or substantially air, rather than a mix of air and a vapor phase 248 of the non-conductive coolant, may be vented to the ambient environment.

As illustrated, a cooling liquid supply 212 and a cooling liquid return 214 may be fluidly coupled to the system 200, e.g., through the outer container 202 and to a cooling module 216 mounted within the volume of the container 202. The cooling liquid supply 212 may be, for example, a chilled water supply, chilled glycol/refrigerant supply, an evaporatively-cooled liquid, or otherwise. (e.g., a liquid coolant that is cooled through mechanical refrigeration, evaporation, or otherwise).

One or more inner containers 224 are mounted within the volume of the outer container 202. Each of the illustrated inner containers 224 seal the liquid phase 250 and the vapor phase 248 of the non-conductive coolant within a volume of the inner container 224 that is in fluid communication, as shown, with the chimney 204. A top portion of the inner container 224 may be formed by a cover 226 that includes, in this implementation, a handle 226. The cover 226 may form part of the sever assembly 234. In alternative embodiments, the cover 226 may be separated from the server assembly 234. In any event, the outer container 202 and inner container 224 (or containers 224) may form a container-in-container system that substantially seals the liquid phase 250 and the vapor phase 248 of the non-conductive coolant within the inner container 224 and chimney 204.

The illustrated server assembly 234, as shown, may be vertically positioned within the inner container 224 and, in this implementation, immersed within the liquid phase 250 of the non-conductive coolant in a sub-cooled liquid layer 222. The server assembly 234, in this example, includes one or more memory modules 238 (e.g., DIMMs or other memory modules), one or more processors 236 (e.g., CPUs or otherwise), and a power interconnect 242. In this example, these components may be mounted on a server board which is mounted to a backing plate 244.

The server assembly also includes one or more I/O patch panels 230 that are mounted above or to the cover 226 and connected to the memory modules 238 and/or processors 236 through connectors 232. As shown, the I/O patch panels 230 are positioned above the vapor phase 248 of the non-conductive coolant within a vapor condensing layer 220 and in an air/vapor mixture 246. The air/vapor mixture 246 may include a mix of air and the vapor phase 246 of the non-conductive coolant. In some embodiments, the mixture 246 may be substantially or mostly (or all) air.

As illustrated in this implementation, a cooling module 216 is mounted within the chimney 204. Although the cooling module 216 shown here is a cooling coil (e.g., fin-and-tube heat exchanger), other forms of cooling modules, such as thermoelectric coolers, Peltier coolers, or otherwise, also are within the scope of the present disclosure. In this example, the cooling module 216 extends through all or most of the height of the chimney 204 (and can also extend a width of the chimney 204 as well). As illustrated, the cooling module 216 extends through several thermodynamic layers within the chimney 204 and the volume of the outer container 202 generally. At the bottom of the chimney 204, the cooling module 216 is positioned in the sub-cooled liquid layer 222, which contains all or mostly the liquid phase 250 of the non-conductive coolant. Here, the cooling module 216 can sub-cool the liquid phase 250, in which the server assemblies 234 are immersed to cool the components of the assemblies 234. As previously described, the sub-cooled liquid layer 222 may be substantially thinner or shallower that the sub-cooled liquid layer 122, thereby resulting in less needed liquid phase 250 of the non-conductive coolant to cool the server assemblies 234. The pump 252, as shown, includes an inlet in the sub-cooled liquid layer 222 and an outlet coupled to a header 254, which in turn is coupled to nozzles 258 mounted in the vapor condensing layer 220 and adjacent the server assemblies 234. The pump 252 may circulate (e.g., constantly, variably, periodically, or otherwise) the liquid phase 250 of the non-conductive coolant to directly cool (e.g., through thermally conductive and/or convective contact) the server assemblies 234. Upon such thermally conductive and/or convective contact, the liquid phase 250 may boil off into the vapor phase 248 of the non-conductive coolant.

Towards the middle of the chimney 204 (and, as shown, much deeper than vapor, condensing layer 120) the cooling module 216 extends through the vapor condensing layer 220, which contains all or mostly the vapor phase 248 of the non-conductive coolant. Here, the cooling module 216 cools, and thereby condenses, the vapor phase 246 to the liquid phase 250. Towards the top of the chimney 204, the cooling module 216 extends through a coolant recovery layer 218, which contains mostly or all air, but could also contain some of the vapor phase 248 of the non-conductive coolant. Here, the cooling module 216 cools the air to condense all or most of any remaining vapor phase 248 of the non-conductive coolant. Thus, at or near the pressure relief device 210, all or mostly air (and not costly non-conductive coolant) is vented to the ambient environment.

Each cover 226 includes one or more vent holes 252 that fluidly couple the volume of the inner containers 224 with the volume of the outer container 202 in the base housing 206. For example, the vent holes 252 allow for gaseous communication from the air/vapor mixture 246 in the coolant recovery layer 218 to exit the volume of the inner containers 224 to the volume of the outer container 204, including the coolant recovery layer 218 in the chimney 204.

Figure 3:
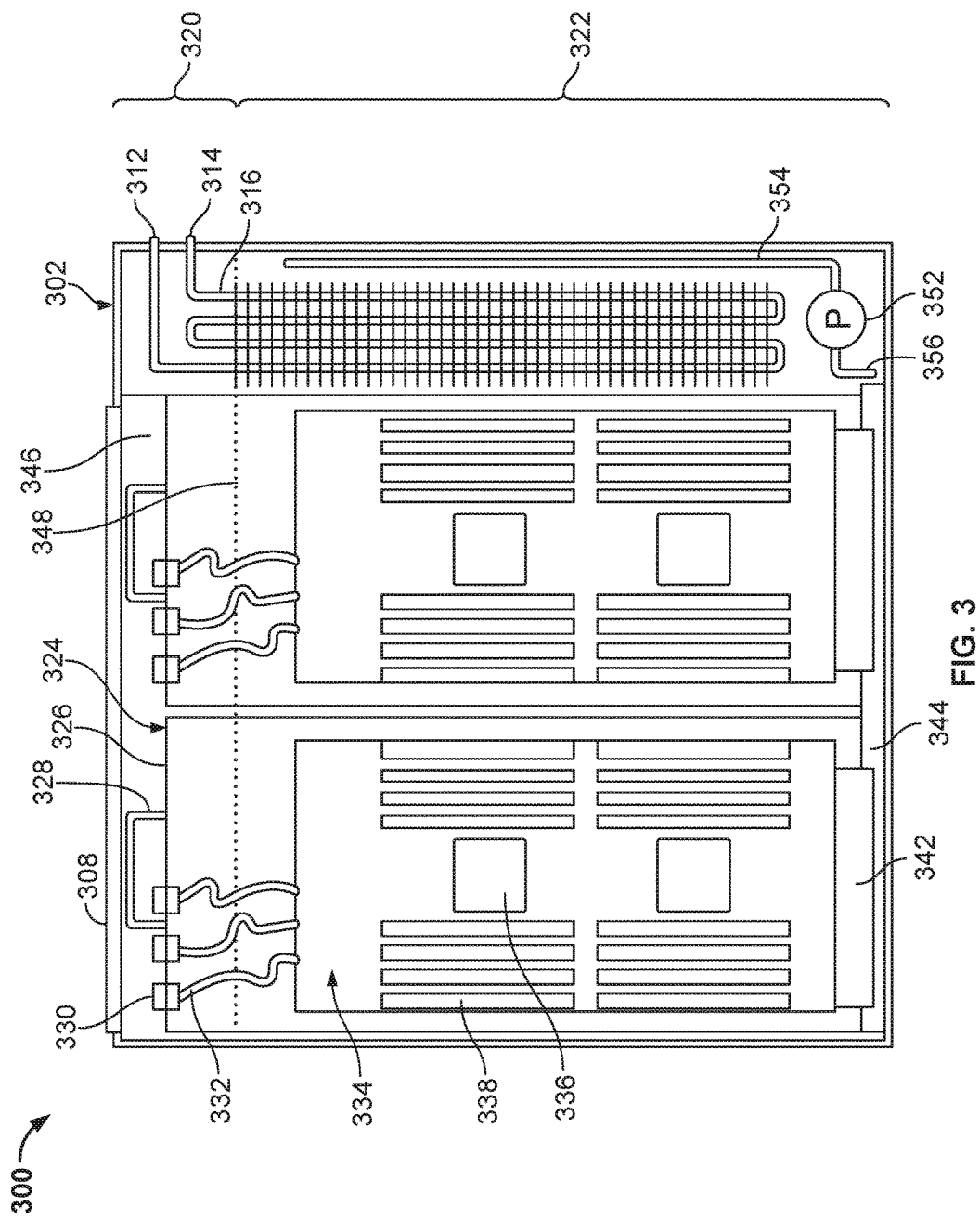
FIG. 3 illustrates a schematic side view of another example implementation of a data center cooling system that uses a non-conductive liquid coolant to cool one or more electronic heat-generating devices.

FIG. 3 illustrates a schematic side view of another example implementation of a data center cooling system 300 that uses a non-conductive liquid coolant. In this example implementation, the data center cooling system 300 may utilize a single-phase (e.g., liquid phase) non-conductive coolant, e.g., a non-conductive coolant that does not vaporize to a vapor phase from a liquid phase based on receiving a heat load from one or more electric heat-generating devices on a server assembly. Some examples of single-phase non-conductive coolant include mineral oil, fluorocarbons, and other non-conductive coolants that have a flash, or boiling, point less than a temperature (e.g., maximum rated temperature) of the electronic heat-generating devices.

In this example implementation, the system 300 includes an outer container 302 that seals the non-conductive coolant (e.g., liquid) within the outer container 302. In the illustrated implementation, the outer container 302 comprises a substantially rectangular prismatic volume (e.g., without a chimney). In some implementations, the cooling system 300 can be approximately 50 inches wide (e.g., across the front of the container 302, not shown in FIG. 3), 30 inches deep, and 36 inches tall.

In the illustrated implementation, access to a volume of the outer container 302 is facilitated by a removable cover 308 that includes or create a fluid seal between the volume and an ambient environment external to the outer container 302. The cover 308 may provide access to one or more server assemblies 334 (described below) as well as the liquid non-conductive coolant 348, as well as other components of the system 300. The cover 308 may, in some implementations, substantially prevent any or all liquid or vapor non-conductive coolant from exiting the outer container through the container 302.

As illustrated, a cooling liquid supply 312 and a cooling liquid return 314 may be fluidly coupled to the system 300, e.g., through the outer container 302 and to a cooling module 316 mounted within the volume of the container 302. The cooling liquid supply 312 may be, for example, a chilled water supply, chilled glycol/refrigerant supply, an evaporatively-cooled liquid, or otherwise. (e.g., a liquid coolant that is cooled through mechanical refrigeration, evaporation, or otherwise).

One or more inner containers 324 are mounted within the volume of the outer container 302. Each of the illustrated inner containers 324 seal the liquid non-conductive coolant 348 within a volume of the inner container 324. A top portion of the inner container 324 may be formed by a cover 326 that includes, in this implementation, a handle 326. As discussed later with reference to FIG. 4A, the cover 326 may form part of the sever assembly 334. In alternative embodiments, the cover 326 may be separated from the server assembly 334. In any event, the outer container 302 and inner container 324 (or containers 324) may form a container-in-container system that substantially seals the liquid non-conductive coolant 348 within the outer container 302.

The illustrated server assembly 334, as shown, may be vertically positioned within the inner container 324 and, in this implementation, immersed within the liquid non-conductive coolant 348 in a liquid layer 322. The server assembly 334, in this example, includes one or more memory modules 338 (e.g., DIMMs or other memory modules), one or more processors 336 (e.g., CPUs or otherwise), and a power interconnect 342. In this example, these components may be mounted on a server board which is mounted to a backing plate 344.

The server assembly also includes one or more I/O patch panels 330 that are mounted above or to the cover 326 and connected to the memory modules 338 and/or processors 336 through connectors 332. As shown, the I/O patch panels 330 are positioned above the liquid non-conductive coolant 348 and within an air layer 320 that contains mostly or only air.

In the illustrated implementation, the server assemblies 334 do not include a filler as described above with respect to the server assemblies 134. Although not shown, the illustrated server assembly 334 can include a filler that is mounted to or with the server assembly 334. The filler, generally, may eliminate or reduce an empty volume of the server assembly 334 (e.g., a space within the volumetric boundaries of the server assembly 334 that is not taken up by the components of the assembly 334). In some aspects, by reducing the amount of empty volume within the inner container 324, the amount of liquid non-conductive coolant 348 needed to cool the components of the server assembly 334 (e.g., the memory modules 338, processors 336, or otherwise) may also be reduced.

As illustrated in this implementation, a cooling module 316 is mounted within the volume of the container 302. Although the cooling module 316 shown here is a cooling coil (e.g., fin-and-tube heat exchanger), other forms of cooling modules, such as thermoelectric coolers, Peltier coolers, or otherwise, also are within the scope of the present disclosure. In this example, the cooling module 316 extends through all or most of the height of the container 302 (and can also extend a width of the outer container 302 as well). As illustrated, the cooling module 316 extends through several thermodynamic layers within the outer container 302 and the volume of the outer container 302, generally. At the bottom of the outer container 302, the cooling module 316 is positioned in the liquid layer 322, which contains all or mostly the liquid non-conductive coolant 348. Here, the cooling module 316 can cool or sub-cool the liquid non-conductive coolant 348, in which the server assemblies 334 are immersed, to cool the components of the assemblies 334. At or near a top of the outer container 302, the cooling module 316 can extend through the air layer 320, but the heat exchanger portion of the cooling module 316 may reside all or mostly in the liquid layer 322.

A pump 352, as shown, includes an inlet in a bottom portion of the liquid layer 222 and an outlet coupled to a header 354, which in turn includes an outlet near or adjacent a top end of the cooling module 316. The pump 352 may circulate (e.g., constantly, variably, periodically, or otherwise) the liquid non-conductive coolant 348 within the volume of the outer container 302 (e.g., from bottom to top) to, e.g., ensure even cooling of the liquid non-conductive coolant 348 by the cooling module 316 (so as to remove the heat transferred from the server assemblies 324 to the liquid non-conductive coolant 348), and ensure cooling of the server assemblies 334 through thermally conductive and/or convective contact. Upon such thermally conductive and/or convective contact, the liquid non-conductive coolant 348 may cool the heat-generating components without boiling or vaporizing.

In some example implementations, a pressure relief device (not shown) may be mounted to a top of the outer container 302. The relief device may be a vent, orifice, pressure relief valve, or otherwise that allows a flow of air from the volume of the outer container 302 to the ambient environment external to the container 302. For example, as a pressure relief valve, the device may be preset to open at a particular pressure (e.g., internal to the container 302) to vent a build-up of air in the container 302. The air may be vented, for example, so that thermodynamic properties or processes within the container (e.g., cooling or otherwise) are not substantially altered from a desired design.

Each cover 326 may also include one or more vent holes (not shown) that fluidly couple the volume of the inner containers 324 with the volume of the outer container 302. For example, the vent holes allow for gaseous communication from the air layer 320 to exit the volume of the inner containers 324 to the volume of the outer container 304.

Figure 4A:
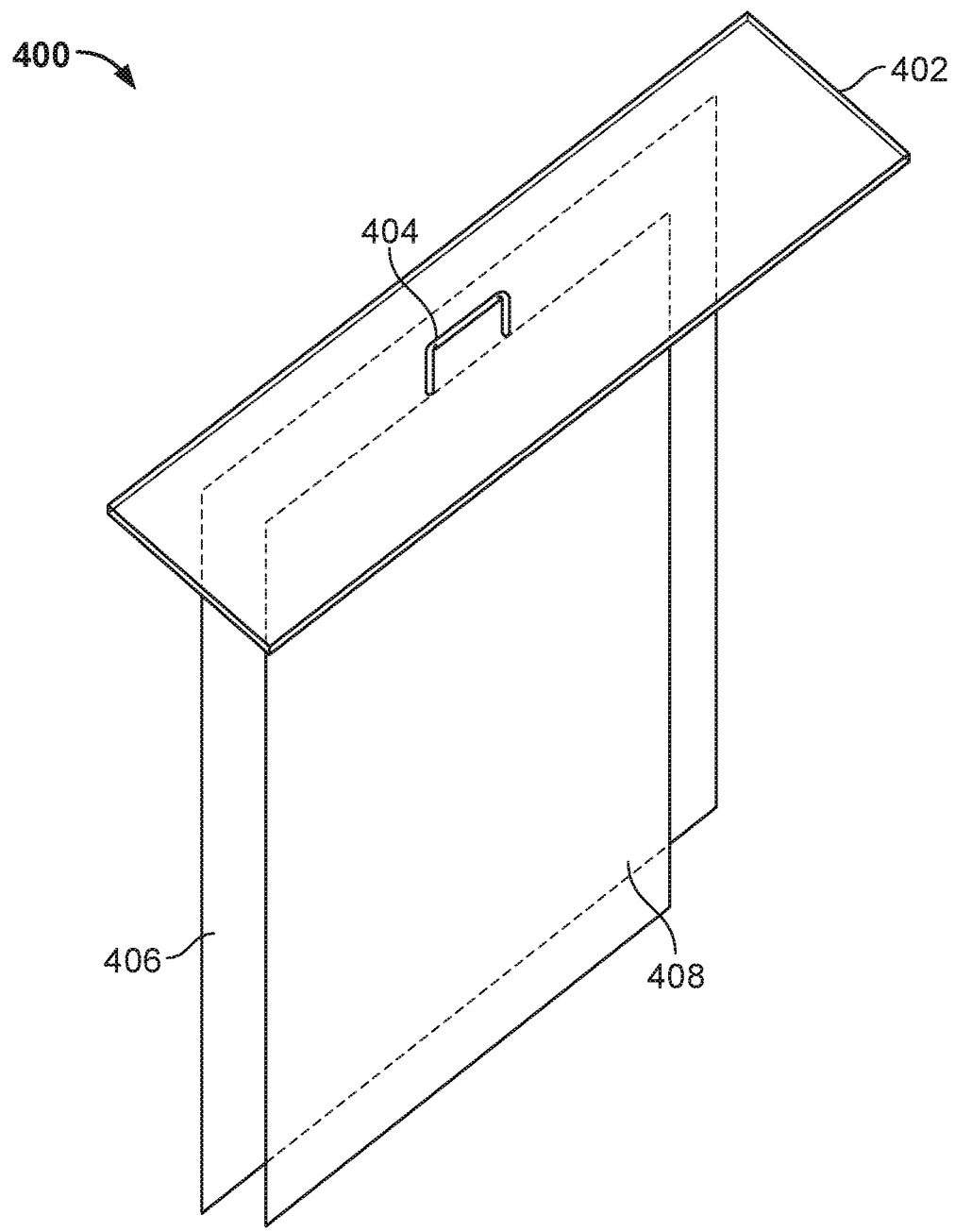
FIG. 4A illustrates an example implementation of a server sub-assembly that may be used in a data center cooling system that uses a non-conductive liquid coolant to cool one or more electronic heat-generating devices.

FIG. 4A illustrates an example implementation of a server assembly 400 that may be used in a data center cooling system that uses a non-conductive coolant to cool one or more electronic heat-generating devices. As illustrated, the examine server assembly 400 includes a server board 408 mounted to a backing plate 406, both of which are mounted to or with a cover 402 that includes a handle 404. The cover 402 can be used, as described above, as a seal or part of a seal for a container (e.g., an inside container) of a data center cooling system that uses a non-conductive fluid coolant (e.g., single-phase or two-phase fluid). As described above, one or more electronic heat-generating components, such as server devices, processors, memory modules, networking devices, can be mounted to the server board 408. As a seal, or by including a seal (e.g., an O-ring or other form of seal), the cover 402 may fluidly separate liquids/vapors enclosed in one container from another container or the ambient environment.

Figure 4B:
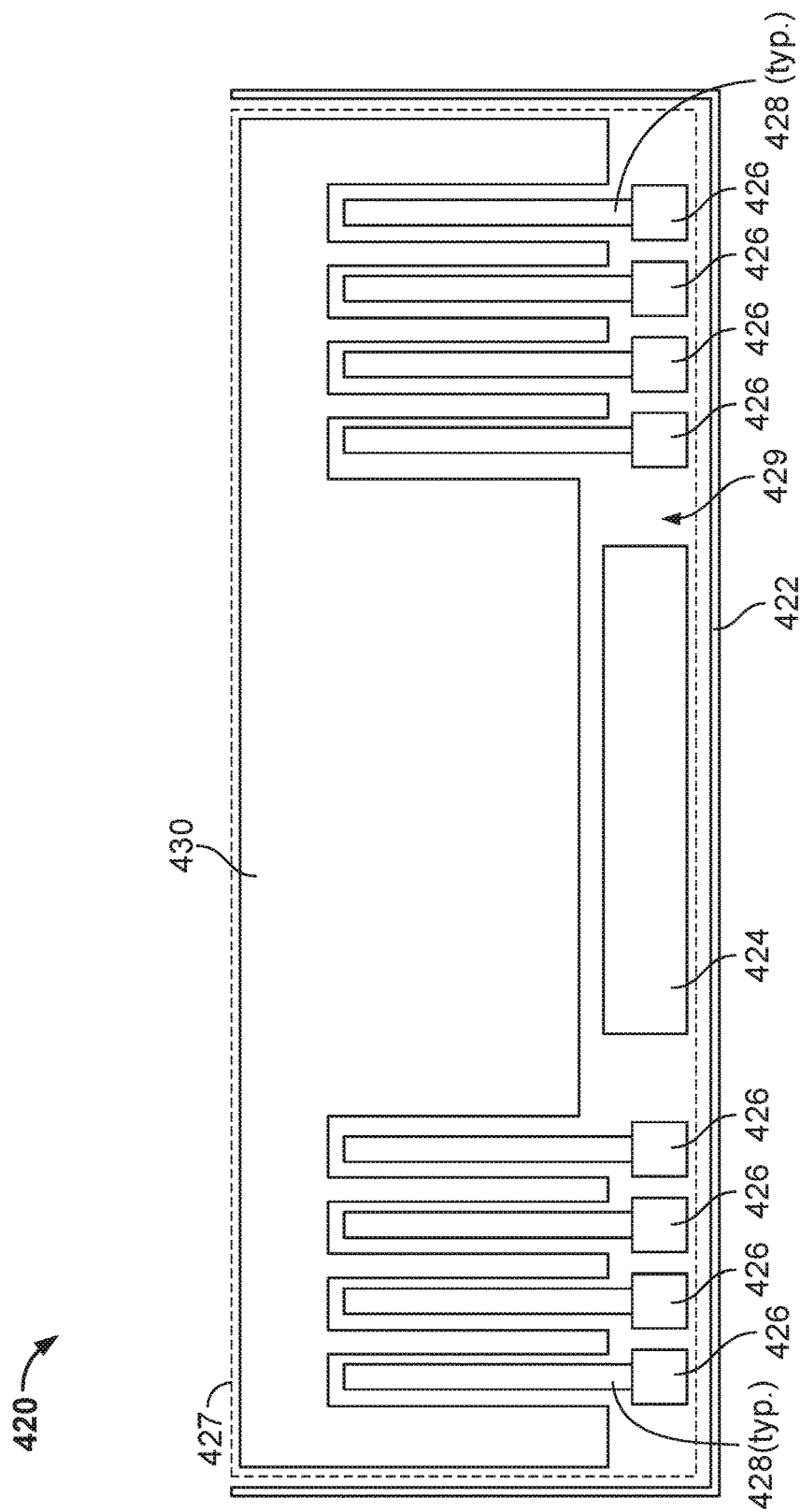

FIG. 4B-4G illustrates example implementations of server sub-assemblies that include a filler member for use in a data center cooling system that uses a non-conductive liquid coolant. FIG. 4B shows a side view of a server sub-assembly 420 that, in some aspects may be a portion of or used with the server assembly 400, and includes a filler 430. Server sub-assembly 420 includes a server board 422 to which one or more processors 424 are mounted and one or more memory modules 428 are connected through slots 426. As illustrated, the server sub-assembly 420 defines a volume 427 into which the processors 424 and memory modules 428 extend to fill a portion of the volume 427. The filler 430, may be formed (e.g., molded or otherwise) to fill most, if not all, of the rest of the volume 427 not filled by the processors 424 and memory modules 428. For example, the filler 430 may be formed so that, when coupled to the server sub-assembly 420 or within the volume 427, a gap 429 is left between the server board 422, processors 424, and memory modules 428, and the filler 430. This gap 429 may provide a small volume (e.g., relative to the volume 427) through which a liquid phase of the non-conductive coolant may flow (or reside), and into which the liquid phase may boil off into a vapor phase. By reducing a volume taken up by the non-conductive coolant from the volume 427 to the gap 429, less non-conductive coolant may be necessary to cool the server sub-assembly 420.

Figure 4C:
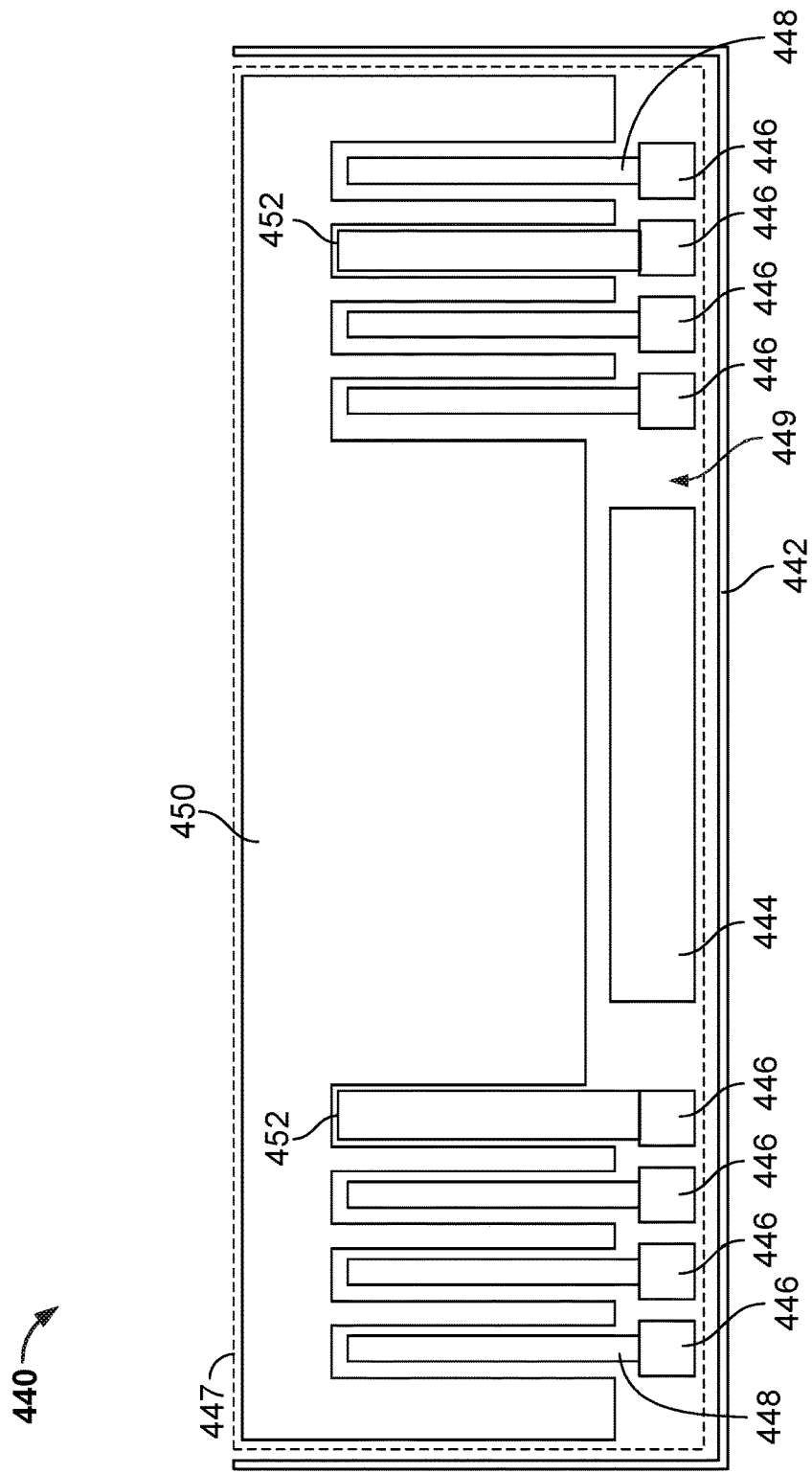

FIG. 4C shows a side view of a server sub-assembly 440 that, in some aspects may be a portion of or used with the server assembly 400, and includes a filler 450 and filler members 452. Server sub-assembly 440 includes a server board 442 to which one or more processors 444 are mounted and one or more memory modules 448 are connected through slots 446. As illustrated, the server sub-assembly 440 defines a volume 447 into which the processors 444 and memory modules 448 extend to fill a portion of the volume 447. The filler 450, may be formed (e.g., molded or otherwise) to fill most, if not all, of the rest of the volume 447 not filled by the processors 444 and memory modules 448. For example, the filler 450 may be formed so that, when coupled to the server sub-assembly 440 or within the volume 447, a gap 449 is left between the server board 442, processors 444, and memory modules 448, and the filler 450.

In this example, one or more slots 446 may not have a corresponding memory module 448 mounted therein. In such a case, the filler member 452 may be formed (e.g., molded) into a similar shape as the absent memory module 448 and mounted within the empty slot 446. This gap 449, which may provide a small volume (e.g., relative to the volume 447) through which a liquid phase of the non-conductive coolant may flow (or reside), and into which the liquid phase may boil off into a vapor phase, may thus be relatively uniform around the heat-generating components even when some of the components are missing. By reducing a volume taken up by the non-conductive coolant from the volume 447 to the gap 449, less non-conductive coolant may be necessary to cool the server sub-assembly 440. Further, if empty slots 446 (or other portions of the server sub-assembly 440) are later needed for memory modules 448, the filler members 452 may be removed. Thus, in this example, the filler 450 and filler members 452 (which may be customizable to fit into any volume shape of the server sub-assembly 440) may provide for an adjustable and changeable filler so that an amount of non-conductive coolant needed to cool the server sub-assembly may be reduced.

FIGS. 4D-4E illustrate cross-section side views of another example implementation of a server assembly 460. Server assembly 460 includes a filler 467 that, as described above, can be mounted or coupled between two face-to-face server boards 463 to reduce an amount of total volume taken within a data center cooling system that uses a non-conductive coolant as described herein. Server assembly 460 includes a cover 461 with a handle 468. In some aspects, the cover 461 can be used, as described above, as a seal or part of a seal for a container (e.g., an inside container) of a data center cooling system that uses a non-conductive fluid coolant (e.g., single-phase or two-phase fluid). Backing plates 462 are coupled to or mounted with the cover 461 and support server boards 463, which are mounted such that one or more heat generating computing devices on each board 463 are facing. The computing devices can include, as shown, memory modules 464 and processors 465 (as well as a variety of other computing devices that generate heat). As shown, a filler 467, such as the fillers 430 or 450, may be mounted within the volume between the boards 463, memory modules 464, and processors 465. In this example implementation, further space for server assemblies 460 may be saved in a data center cooling system, such as the systems 100, 200, 300, or otherwise, so that less non-conductive coolant may be required and/or the server assemblies 460 may be more densely packed within the system.

FIG. 4F illustrates a cross-section side view of another example implementation of a server assembly 470. Server assembly 470 includes a filler 477 that, as described above, can be mounted or coupled between two face-to-face server boards 473 to reduce an amount of total volume taken within a data center cooling system that uses a non-conductive coolant as described herein. Backing plates 472 are coupled to or mounted with a cover and support server boards 473, which are mounted such that one or more heat generating computing devices on each board 473 are facing. The computing devices can include, as shown, memory modules 474 and processors 475 (as well as a variety of other computing devices that generate heat). As shown, a filler 477, such as the fillers 430 or 450, may be mounted within the volume between the boards 473, memory modules 474, and processors 475. In this example implementation, further space is saved by staggering the memory modules 474 from the server boards 473. For instance, as shown, the memory modules 474 are interleaved so that the server boards 473 can be more closely positioned while facing each other. Thus, further space for server assemblies 470 may be saved in a data center cooling system, such as the systems 100, 200, 300, or otherwise, so that less non-conductive coolant may be required and/or the server assemblies 470 may be more densely packed within the system.

FIG. 4G illustrates a cross-section side view of another example implementation of a server assembly 490. Server assembly 490 includes a filler 497 that, as described above, can be mounted or coupled between two face-to-face server boards 493 to reduce an amount of total volume taken within a data center cooling system that uses a non-conductive coolant as described herein. In this example, there are no backing plates, because the filler 497 provides structure support for the server boards 493, which are mounted such that one or more heat generating computing devices on each board 493 are facing. The computing devices can include, as shown, memory modules 494 and processors 495 (as well as a variety of other computing devices that generate heat). As shown, a filler 497, such as the fillers 430 or 450, may be mounted within the volume between the boards 493, memory modules 494, and processors 495. As with server assembly 470, further space is saved by staggering the memory modules 494 from the server boards 493. For instance, as shown, the memory modules 494 are interleaved so that the server boards 493 can be more closely positioned while facing each other. Thus, by eliminating the backing plates and interleaving the memory modules 494, further space for server assemblies 490 may be saved in a data center cooling system, such as the systems 100, 200, 300, or otherwise, so that less non-conductive coolant may be required and/or the server assemblies 490 may be more densely packed within the system.

FIG. 5 is a schematic side view of another example implementation of a data center cooling system 500 that uses a non-conductive coolant to cool one or more electronic heat-generating devices. Generally, the data center cooling system 500 includes a container-in-container approach to cooling the one or more electronic heat-generating devices with a non-conductive coolant, in which an outer container is a human-occupiable structure.

As shown, the data center cooling system 500 includes a number of containers 504 positioned within a human-occupiable structure 502. Each container 504 may include a vent 522 and be fluidly connected to a cooling fluid supply 506 and a cooling fluid return 508. Generally, each of the containers 504 may contain one or more server assemblies (as described above) that include one or more electronic heat-generating devices immersed in a non-conductive coolant (e.g., a liquid or vapor phase of the non-conductive coolant), and may also include one or more cooling modules coupled to the cooling fluid supply 506 and a cooling fluid return 508. Each of the containers 504 may fluidly isolate the non-conductive coolant (e.g., whether in liquid or vapor form) from a human-occupiable workspace defined within the human-occupiable structure 502. The vent 522 may allow an amount of air to escape the container 504, e.g., based on a pressure within the container 504. In some aspects, the vent 522 may allow a mixture of air and a vapor phase of the non-conductive coolant to escape into the human-occupiable structure 502.

The illustrated data center cooling system 500 includes one or more cooling modules 512. The cooling module 512 is shown in a plenum or attic space, but the module 512 may be positioned in other locations, such as within the human-occupiable workspace, on a roof of the human-occupiable structure 502, or otherwise. Generally, the cooling module 512 has an inlet in airflow communication with a return airflow 510 from the human-occupiable workspace so that the return airflow 510 can be circulated (e.g., by a fan in the cooling module 512) through a cooling coil (e.g., in the cooling module 512). In some aspects, the cooling module 512 may receive the return airflow 510, cool the return airflow 510 to provide a supply airflow 518 to the human-occupiable workspace, and condense the vapor-phase of the non-conductive coolant, which can be returned to the containers 504 in a conduit 524.

The illustrated data center cooling system 500 can also include one or more exhaust modules 514. For example, in some cases, cooling is not needed for the human occupiable structure 502, but air changes may be required by code or otherwise. In such example cases, the exhaust module 514 may circulate room airflow 517 with a fan (e.g., mounted in the exhaust module 514), clean the airflow 517 through a filter (e.g., in the exhaust module 514) if necessary, and circulate an exhaust airflow 520 to an ambient environment. In some aspects, heating or cooling devices may be part of or used with the exhaust module 514. In some aspects, both cooling modules 512 and exhaust modules 514 may be used in the data center cooling system 500. In some aspects, only cooling modules 512 or exhaust modules 514, but not both, are used in the data center cooling system 500.

The illustrated human-occupiable structure 502, as mentioned above, may provide for or be an outer container in a container-in-container system that uses a non-conductive coolant to cool server assemblies, while the containers 504 are the inner containers. In some aspects, the liquid phase of the non-conductive coolant is contained in the containers 504 (and further contained by the structure 502) so as to minimize or prevent exposure of the non-conductive coolant to the ambient environment. Further, the vapor phase of the non-conductive coolant (if applicable), may be largely contained in the containers 504. And as described above, the vapor phase of the non-conductive coolant may be condensed and returned to the containers 504. In some aspects, the vapor phase of the non-conductive coolant, as well as air, may be vented to the ambient environment from the human-occupiable structure 502 through a vent 516.

Figure 6:
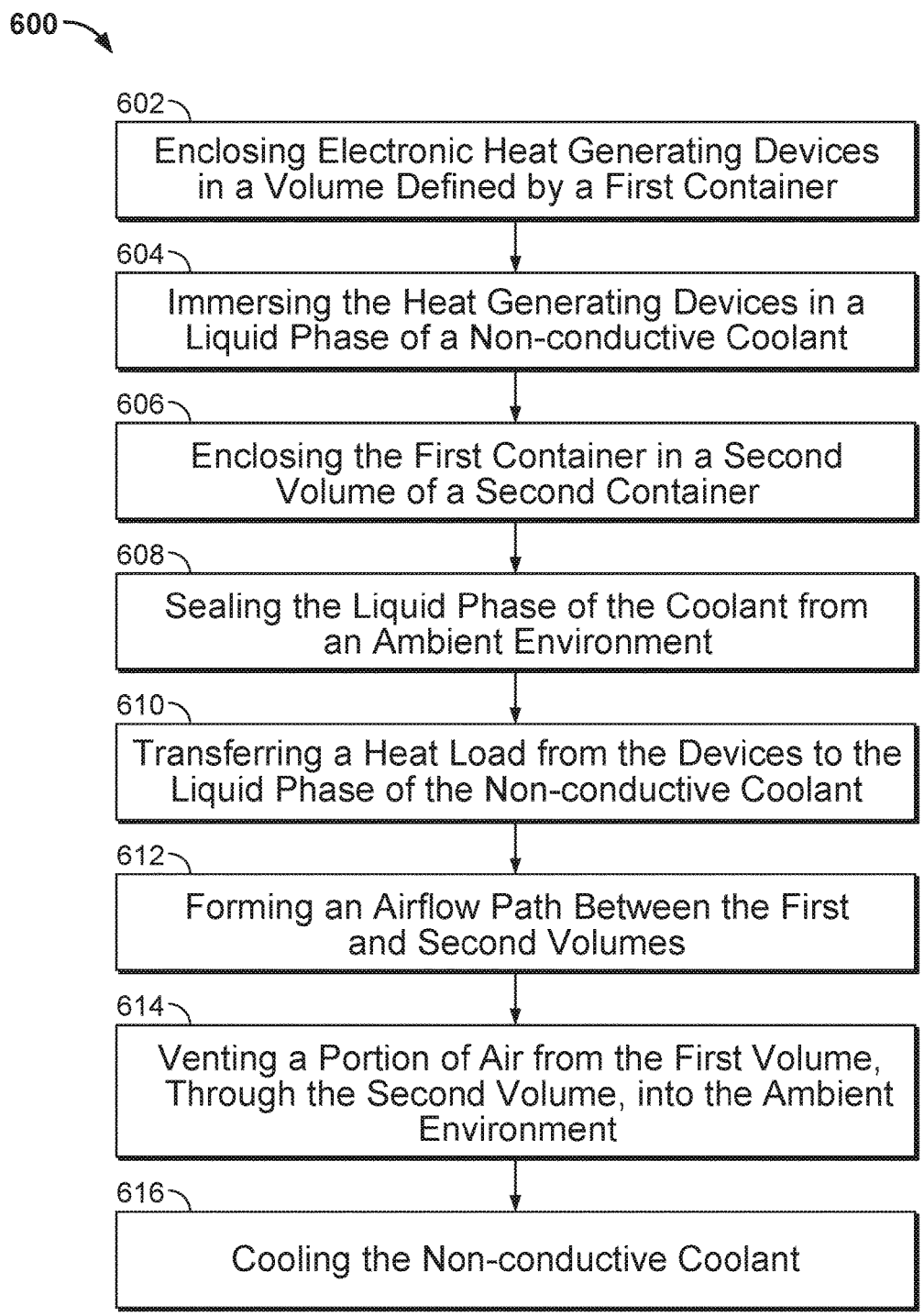
FIGS. 6-7 are flowcharts that illustrate example methods of cooling heat-generating devices in a data center with a non-conductive liquid coolant.
Figure 7:
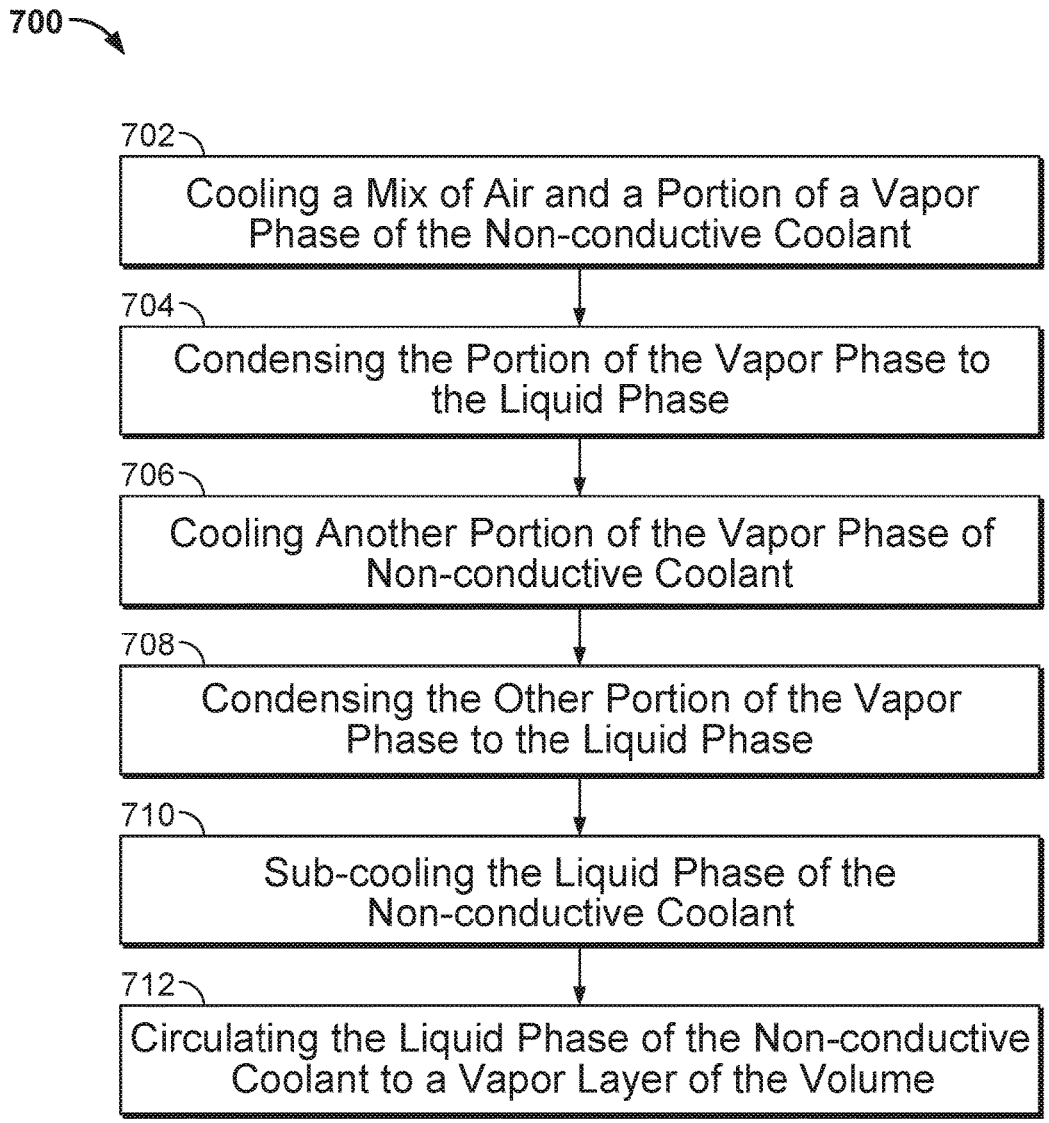

FIGS. 6-7 are flowcharts that illustrate example methods of cooling heat-generating devices in a data center with a non-conductive coolant. FIG. 6 shows method 600, which may begin by enclosing electronic heat-generating devices (e.g., processors, memories, networking devices, and otherwise) in a volume defined by a first container in step 602. In some aspects, the devices are mounted on a server board of a server assembly, such as the server assembly 400.

Method 600 may continue by immersing the heat-generating devices in a liquid phase of a non-conductive coolant in step 604. The non-conductive coolant may be one of several multi-phase non-conductive, or dielectric coolants, such as aromatics, silicate-esters, aliphatics, or silicones, as well as single-phase coolants such as mineral oil or fluorocarbons. The non-conductive coolant, generally, may allow immersion of the electronic devices without conducting and electric charge, or conducting such a small electric charge that operation of the electronic devices is not affected.

Method 600 may continue by enclosing the first container in a second volume of a second container in step 606. For example, the first container may be smaller such that many of the first containers enclosing the heat-generating devices may fit in the volume of the second container. In some aspects, the second container is a human-occupiable structure. In some implementations, the first container is formed, at least in part by a portion of a server assembly, such as a cover that sealingly engages with the first container. In some aspects, the second container is a two-part container (e.g., attached or integrally formed), which includes a base section and chimney section that extends above a top of the base section.

Method 600 may continue by sealing the liquid phase of the non-conductive coolant from an ambient environment in step 608. For example, in some aspects, the liquid phase, and in some aspects a vapor phase (e.g., for multi-phase coolants) of the non-conductive coolant may be sealed within the second container from the ambient environment, but able to flow within the first and second containers to cool the electronic devices. In some aspects, portions of both the first and second containers are flooded with the liquid phase of the non-conductive coolant, while also enclosing the vapor phase of the non-conductive coolant. In some aspects, such as for single-phase coolants, only a liquid phase of the non-conductive coolant fills portions of the first and second containers. In some aspects, such as when the second container is a human-occupiable structure, the liquid phase of the non-conductive coolant may be contained completely or substantially within the first container and the vapor phase of the non-conductive coolant may be mostly contained in the first container but could be vented to the second container as well.

Method 600 may continue by transferring a heat load from the heat-generating devices to the liquid phase of the non-conductive coolant in step 610. For example, as the liquid phase of the non-conductive coolant comes into thermally conductive and convective contact with the electronic devices, the heat load from the devices boils off all or a portion of the liquid phase in contact with the devices. The vaporization of the liquid phase removes the heat from the electronic devices, thereby maintaining a particular or desired temperature of the devices during operation.

Method 600 may continue by forming an airflow path between the first and second volumes in step 612. For example, in some aspects, such as when a two-phase non-conductive coolant is used to cool the electronic devices, air or a mixture of air and a vapor phase of the non-conductive coolant may be vented from the first container to the second container, e.g., to maintain a particular pressure in the first container or otherwise. In some aspects, the airflow path may be formed by one or more holes in a portion of a server assembly, such as a cover, which forms a portion of the first container.

Method 600 may continue by venting a portion of air from the first volume, through the second volume, into the ambient environment in step 614. In some aspects, air that accumulated within the second container, such as air that has been vented into the second container from the first container, is vented to the ambient environment. In some aspect, the air is a mixture of air and the vapor phase of the non-conductive coolant. In some aspects, the venting may occur to maintain a particular pressure, such as within the second container. The venting may be controlled, e.g., with a pressure relief device that vents the portion of air based, at least in part, on a pressure of the second container.

Method 600 may continue by cooling the non-conductive coolant in step 616. In some aspects, this heat load that is transferred to the non-conductive coolant is further transferred from the non-conductive coolant to another cooling medium, such as a cooling liquid circulated to the first container to remove the heat from the non-conductive coolant. In some aspects, a cooling module may be mounted within the second container (or in some aspects, the first container), to receive the cooling liquid to cool the non-conductive coolant. In some aspects, a flow of cooling liquid is not circulated to the first or second containers, and the cooling module comprises a thermoelectric or Peltier-type cooling module. In some aspects, the liquid phase of the non-conductive coolant is circulated to flow or spray over the electronic devices and/or the cooling module.

FIG. 7 shows method 700, which may be or include a more detailed implementation of step 616 of method 600. For example, method 700 may begin by cooling a mix of air and a portion of a vapor phase of the non-conductive coolant in step 702. In some aspects, this cooling may be performed by a cooling module (e.g., a cooling coil) enclosed with the non-conductive coolant. The cooling module may extend through one or more thermodynamic layers of one or more containers of the data center cooling system. In some aspects, the mix of air and the portion of the vapor phase of the non-conductive coolant may be at or near a top portion of one or more of the containers in the cooling system based on, for instance a relative density of the mixture (e.g., relative to other fluids in the containers).

Method 700 may continue by condensing the portion of the vapor phase to a liquid phase of the non-conductive coolant in step 704. As the non-conductive coolant can be a costly expense in data center cooling systems, capturing and retaining as much of it as possible, rather than venting the vapor phase of the non-conductive coolant (e.g., along with air), may be preferable. Thus, in some aspects, the cooling module may be designed (e.g., by cooling capacity, entering cooling liquid temperature and/or flow rate, or otherwise), to cool the air and vapor phase mixture at a temperature just below a dew point of the non-conductive coolant. In some aspects, the dew point of the non-conductive coolant may be higher than a dew point of the air in the mixture, thereby ensuring that water does not condense from the air.

Method 700 may continue by cooling another portion of the vapor phase of the non-conductive coolant in step 706. For example, in some aspects, the fluids in one or more containers in the data center cooling system may be substantially stratified. The air and vapor phase mixture may be near a top of the one or more container as described above. Another portion of the vapor phase may make up a layer below the air and vapor phase mixture that is primarily vapor phase of the non-conductive coolant. The cooling module may extend through the primarily vapor phase layer and cool this layer.

Method 700 may continue by condensing the other portion of the vapor phase to the liquid phase of the non-conductive coolant in step 708. As in step 704, the vapor phase (e.g., in the primarily vapor phase layer) of the non-conductive coolant may be condensed by cooling such fluid below its dew point. Once condensed, the liquid phase of the non-conductive coolant may naturally circulate (e.g., by density) downward in the one or more containers of the data center cooling system.

Method 700 may continue by sub-cooling a liquid phase of the non-conductive coolant in step 710. For example, in some aspects, a bottom layer (e.g., at or near a bottom of the one or more containers of the data center cooling system) may be or include a liquid phase of the non-conductive coolant. The cooling module may sub-cool the liquid phase of the non-conductive coolant to, for instance, ensure that all or substantially all of the non-conductive coolant in which the electronic devices are immersed is in the liquid phase, rather than a multi-phase non-conductive coolant of liquid and vapor. In some aspects, by ensuring that all or substantially all of the non-conductive coolant in which the electronic devices are immersed is in the liquid phase, heat transfer from the electronic devices to the non-conductive coolant is increased and/or optimized.

Method 700 may continue by circulating the liquid phase of the non-conductive coolant to a vapor phase layer, such as the primarily vapor phase layer, of the one or more containers in step 712. For example, in some aspects, all of the electronic devices (e.g., mounted on a server assembly) may not be immersed in the liquid phase of the non-conductive coolant. Some of the electronic devices may be positioned within the one or more containers at the primarily vapor phase layer. The liquid phase of the non-conductive coolant may be circulated (e.g., by a pump positioned with an inlet in liquid communication with the liquid phase of the non-conductive coolant) to contact (e.g., by spray or otherwise) the electronic devices positioned within the primarily vapor phase layer.

A number of embodiments have been described. Nevertheless, it will be understood that various modifications may be made without departing from the spirit and scope of what is described. For example, the steps of the exemplary flow charts in FIGS. 6-7 may be performed in other orders, some steps may be removed, and other steps may be added. As another example, data center cooling systems that utilize a container-in-container concept as described herein may not use a chimney as part of an outer container, but instead use a substantially rectangular (or square) prismatic volume. Further, some implementations that use a single container (e.g., only an outside container) may or may not utilize a chimney. As another example, a data center cooling system that uses a single-phase non-conductive coolant according to the present disclosure may use a container-in-container approach or a single container approach, with or without a chimney as described herein. Accordingly, other embodiments are within the scope of the following claims.

What is claimed is:

1. A server assembly, comprising:
   a server board comprising a plurality of connector slots coupled to a front surface of the server board;
   a plurality of computing devices installed in at least a portion of the plurality of connector slots to define a server board topography; and
   a filler member coupled to the server board, the filler member shaped to substantially mirror the server board topography to define a gap between the server board with the plurality of computing devices and the filler member without contact between the plurality of computing devices and the filler member, the gap comprising a flow path configured to receive a dielectric, non-conductive liquid cooling liquid from a cooling liquid source external to a volume defined by the server assembly and distribute the cooling liquid to flow in the gap in contact with the plurality of computing devices and the filler member.

2. The server assembly of claim 1, wherein the filler member comprises a filler surface that faces the front surface of the server board.

3. The server assembly of claim 1, further comprising a backing plate mounted to a back surface of the server board opposite the front surface.

4. The server assembly of claim 1, further comprising a filler sub-member installed in a particular one of the plurality of connector slots such that the server board topography is defined, at least in part, by the installed filler sub-member.

5. The server assembly of claim 1, wherein the gap is about 1-2 mm.

6. The server assembly of claim 5, wherein the gap is based, at least in part, on a rate of heat transfer from the plurality of computing devices to the cooling liquid enclosed in the gap and in at least one of thermal conductive or convective contact with the plurality of computing devices.

7. The server assembly of claim 1, wherein the gap comprises a boiling zone for the non-conductive liquid.

8. The server assembly of claim 1, wherein the filler member comprises a molded member made of a non-porous material.

9. A method for cooling computing devices in a data center, comprising:
   installing a server board that comprises a plurality of connector slots coupled to a front surface of the server board in a rack of a data center;
   installing a plurality of computing devices in at least a portion of the plurality of connector slots to define a server board topography;
   coupling a filler member to the server board, the filler member shaped to substantially mirror the server board topography to define a gap between the server board with the plurality of computing devices and the filler member without contact between the plurality of computing devices and the filler member, the gap comprising a flow path configured to receive a non-conductive cooling liquid;
   operating the plurality of computing devices; and
   circulating the non-conductive cooling liquid into the flow path between the filler member and the plurality of computing devices to contact the operating plurality of computing devices and the filler member.

10. The method of claim 9, wherein coupling the filler member to the server board comprises coupling the filler member to the server board so that a filler surface of the filler member faces the front surface of the server board.

11. The method of claim 9, further comprising coupling a backing plate to a back surface of the server board opposite the front surface.

12. The method of claim 9, further comprising installing a filler sub-member in a particular one of the plurality of connector slots such that the server board topography is defined, at least in part, by the installed filler sub-member.

13. The method of claim 9, wherein the gap is about 1-2 mm.

14. The method of claim 13, wherein the gap is based, at least in part, on a rate of heat transfer from the plurality of computing devices to the cooling liquid enclosed in the gap and in at least one of thermal conductive or convective contact with the plurality of computing devices.

15. The method of claim 9, wherein the gap comprises a boiling zone for the non-conductive liquid.

16. The method of claim 9, wherein the filler member comprises a molded member made of a non-porous material.

17. A method, comprising:
   installing a server board that comprises a plurality of connector slots coupled to a front surface of the server board in a rack of a data center;
   installing a plurality of computing devices in at least a portion of the plurality of connector slots to define a server board topography;
   coupling a filler member to the server board, the filler member shaped to substantially mirror the server board topography to define a gap of about 1-2 mm between the server board with the plurality of computing devices and the filler member, the gap comprising a flow path configured to receive a dielectric cooling liquid from a source external to a volume defined by a server assembly that comprises the server board;
   installing a filler sub-member in a particular one of the plurality of connector slots such that the server board topography is defined, at least in part, by the installed filler sub-member;
   circulating the dielectric cooling liquid within the flow path and in contact with the plurality of computing devices and the filler member and filler sub-member; and
   removing heat from the plurality of computing devices by boiling the dielectric cooling liquid in the flow path.

18. The method of claim 17, wherein coupling the filler member to the server board comprises coupling the filler member to the server board so that a filler surface of the filler member faces the front surface of the server board.

19. The method of claim 17, further comprising coupling a backing plate to a back surface of the server board opposite the front surface.

20. The method of claim 17, wherein the gap is based, at least in part, on a rate of heat transfer from the plurality of computing devices to the dielectric cooling liquid enclosed in the gap and in at least one of thermal conductive or convective contact with the plurality of computing devices.

21. The method of claim 17, wherein the gap comprises a boiling zone for the dielectric cooling liquid.

22. The method of claim 17, wherein the filler member comprises a molded member made of a non-porous material.

* * * * *